(12) United States Patent
Jeon et al.

(10) Patent No.: US 12,039,185 B2
(45) Date of Patent: Jul. 16, 2024

(54) CONTROLLER FOR STORING PERFORMANCE INFORMATION BASED ON TEST OPERATION RESULT, OPERATING METHOD THEREOF AND COMPUTING SYSTEM INCLUDING THE SAME

(71) Applicant: SK hynix Inc., Gyeonggi-do (KR)

(72) Inventors: Jeong Ho Jeon, Gyeonggi-do (KR); Kang Rak Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 161 days.

(21) Appl. No.: 17/749,235

(22) Filed: May 20, 2022

(65) Prior Publication Data

US 2023/0176766 A1 Jun. 8, 2023

(30) Foreign Application Priority Data

Dec. 7, 2021 (KR) .......................... 10-2021-0173990

(51) Int. Cl.
*G11C 7/00* (2006.01)
*G06F 3/06* (2006.01)
*G11C 29/02* (2006.01)

(52) U.S. Cl.
CPC .......... *G06F 3/0653* (2013.01); *G06F 3/0604* (2013.01); *G06F 3/0659* (2013.01); *G06F 3/0679* (2013.01); *G11C 29/028* (2013.01)

(58) Field of Classification Search
CPC ....................................................... G11C 29/12

USPC .......................................................... 365/201
See application file for complete search history.

(56) References Cited

U.S. PATENT DOCUMENTS

2015/0098281 A1* 4/2015 Byeon ....................... G11C 8/12
327/540
2019/0237151 A1* 8/2019 Cho ........................ G11C 29/02

FOREIGN PATENT DOCUMENTS

KR 10-2001-0095326 A 11/2001
KR 10-2021-0008712 A 1/2021

OTHER PUBLICATIONS

NVM Express TM Base Specification, Jun. 10, 2019, p. 1-403, Revision 1.4.

* cited by examiner

*Primary Examiner* — Hoai V Ho
(74) *Attorney, Agent, or Firm* — IP & T GROUP LLP

(57) ABSTRACT

The present technology includes a controller controlling an operation of a semiconductor memory device in response to a test request received from an external device. The controller includes a memory test controller and a performance information storage. The memory test controller generates a command corresponding to a test request received from the external device. The performance information storage stores a test operation result of the semiconductor memory device performed in response to the command.

17 Claims, 22 Drawing Sheets

| No. | TEST TYPE | TEST TARGET RANGE | TEST RESULT |

| 1 | Read | 1 MB | T1 |

| 1 | Read | 1 MB | T1 |
| 2 | Write | 1 MB | T2 |

| 1 | Read | 1 MB | T1 |
| 2 | Write | 1 MB | T2 |
| 3 | Read | 5 MB | T3 |

| 1 | Read | 1 MB | T1 |
|---|---|---|---|
| 2 | Write | 1 MB | T2 |
| 3 | Read | 5 MB | T3 |
| 4 | Write | 3 MB | T4 |
| 5 | Write | 10 MB | T5 |
| ... | ... | ... | ... |
| 10 | Read | 4 MB | T10 |

| 11 | Write | 6 MB | T11 |
|---|---|---|---|
| 2 | Write | 1 MB | T2 |
| 3 | Read | 5 MB | T3 |
| 4 | Write | 3 MB | T4 |
| 5 | Write | 10 MB | T5 |
| ... | ... | ... | ... |
| 10 | Read | 4 MB | T10 |

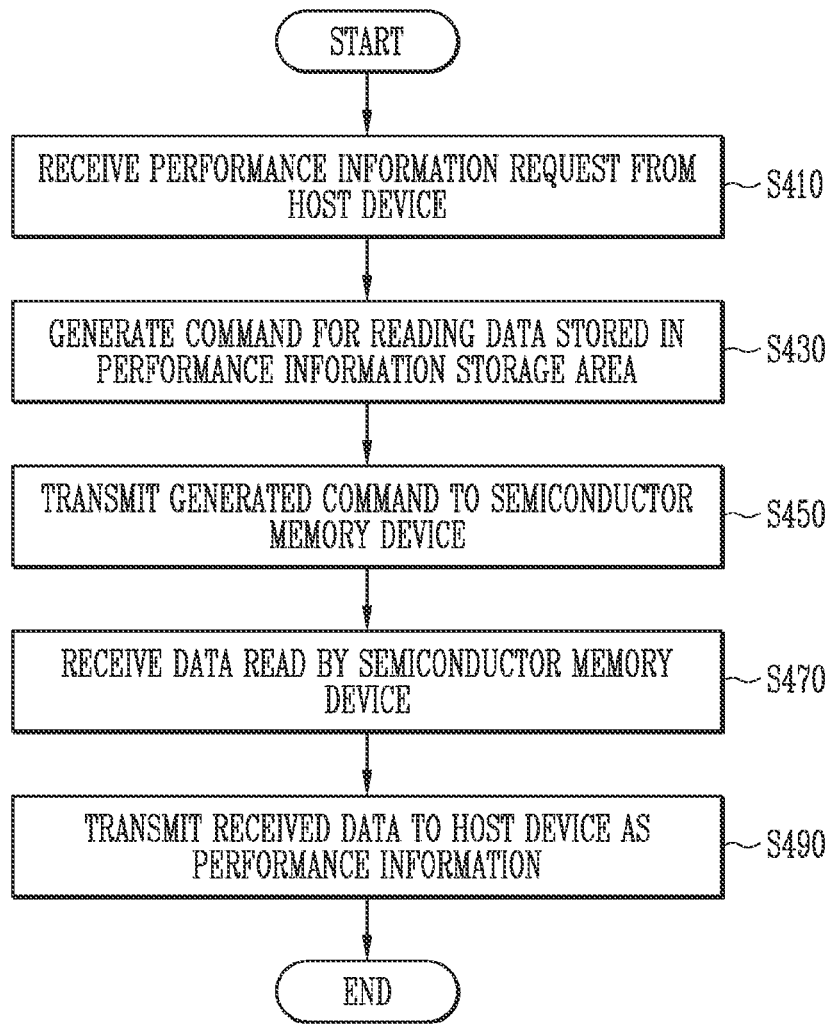

FIG. 22

| No. | TEST TYPE | TEST TIME | TEST TARGET RANGE | MEASUREMENT VALUE | TEST PERFORMANCE STATUS | THRESHOLD VALUE EXCESS OR NOT |
|---|---|---|---|---|---|---|
| | | | | \multicolumn{3}{c}{TEST RESULT} | | |

FIG. 23

| 1 | READ | 10SEC | 1GB | 500Mb/sec | SUCCESS | 0 |
|---|---|---|---|---|---|---|
| 2 | WRITE | 1SEC | 500MB | – | TEST FAIL | – |
| 3 | WRITE | 10SEC | 2GB | 480Mb/sec | SUCCESS | 0 |
| 4 | READ | 1SEC | 1GB | – | TEST STOP | – |
| ... | ... | ... | ... | ... | ... | ... |
| N | READ/WRITE | 10SEC | 1GB | 505Mb/sec 100Mb/sec | SUCCESS | X |

CONTROLLER FOR STORING PERFORMANCE INFORMATION BASED ON TEST OPERATION RESULT, OPERATING METHOD THEREOF AND COMPUTING SYSTEM INCLUDING THE SAME

CROSS-REFERENCE TO RELATED APPLICATION

The present application claims priority under 35 U.S.C. § 119(a) to Korean patent application number 10-2021-0173990, filed on Dec. 7, 2021, the entire disclosure of which is incorporated herein by reference.

BACKGROUND

1. Field of Invention

The present disclosure relates to an electronic device, and more particularly, to a storage device, a host device, and a computing system including the same.

2. Description of Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a memory device designed in order to resolve a limit of an integration degree of a two-dimensional semiconductor memory device, and may include a plurality of memory cells that are vertically stacked on a semiconductor substrate. Moreover, a controller may control an operation of the semiconductor memory device according to a request received from a host device.

SUMMARY

An embodiment of the present disclosure provides a storage device and a method of operating the same capable of providing performance information of a semiconductor memory device to a host device.

According to an embodiment of the present disclosure, a controller includes a memory test controller and a performance information storage. The memory test controller receives a test request from an external device, transmits, to the external device, a response indicating whether performance of a test operation corresponding to the test request is possible, and generates a command in response to the test request. The performance information storage stores a result of the test operation, which is performed by a semiconductor memory device in response to the command.

In an embodiment of the present disclosure, the memory test controller may determine, based on the test request, a size of data on which the test operation is to be performed.

In an embodiment of the present disclosure, the controller may provide, to the external device, the result stored in the performance information storage, in response to a performance information request received from the external device.

According to another embodiment of the present disclosure, a method of operating a controller includes receiving a test request from an external device, determining whether performance of a test operation corresponding to the test request is possible, transmitting, to the external device, a response indicating whether the performance of the test operation is possible, generating a command in response to the test request, transmitting the command to a semiconductor memory device to control the semiconductor memory device to perform the test operation, and updating performance information based on a result of the test operation and storing the updated performance information.

In an embodiment of the present disclosure, the method may further include receiving a performance information request from the external device, and transmitting the stored performance information to the external device in response to the performance information request.

According to still another embodiment of the present disclosure, a computing system includes a storage device and a host device. The storage device stores data. The host device generates a test request for testing the storage device and transmits the test request to the storage device. The storage device performs a read test operation or a write test operation of a semiconductor memory device included in the storage device in response to the test request, and stores a result of the read test operation or the write test operation as performance information.

In an embodiment of the present disclosure, the performance information may include at least one of a read speed during the read test operation or a write speed during the write test operation, and data indicating whether the read speed or the write speed is greater than a predetermined threshold value.

In an embodiment of the present disclosure, the host device may transmit a performance information request to the storage device. The storage device may transmit the performance information to the host device in response to the performance information request. The host device may determine whether the storage device is normal based on the data indicating whether the read speed or the write speed is greater than the predetermined threshold value included in the performance information.

According to still another embodiment of the present disclosure, an operation method of a controller is provided. The method includes controlling, in response to a first request, a memory device to perform an operation to measure performance of the memory device, accumulatively storing an information entry representing the measured performance according to a least recently used scheme, and providing, in response to a second request, one or more of the accumulated entries.

The present technology may provide a storage device capable of providing performance information from a semiconductor memory device to a host device.

BRIEF DESCRIPTION OF THE DRAWINGS

FIGS. 11A to 11E are diagrams illustrating an update of the performance information storage according to an embodiment of the present disclosure.

FIG. 20 is a flowchart illustrating a method of operating the controller that provides the performance information in response to the request of the host device according to an embodiment of the present disclosure.

FIG. 21 is a diagram illustrating a test request transmitted from the host device to the storage device according to an embodiment of the present disclosure.

FIG. 22 is a diagram illustrating still another configuration of the entry included in the performance information according to an embodiment of the present disclosure.

FIG. 23 is a diagram illustrating the performance information including the entry of FIG. 22 according to an embodiment of the present disclosure.

DETAILED DESCRIPTION

The advantages and features of the present disclosure, and a method of accomplishing the advantages and features will be described through embodiments that are described in detail below together with the accompanying drawings. However, the present disclosure is not limited to the embodiments described herein but may be embodied in other forms. The present embodiments are provided to describe the technical spirit of the present disclosure in detail to those skilled in the art to which the present disclosure pertains so that those skilled in the art may easily implement the technical spirit of the present disclosure.

Figure 1:
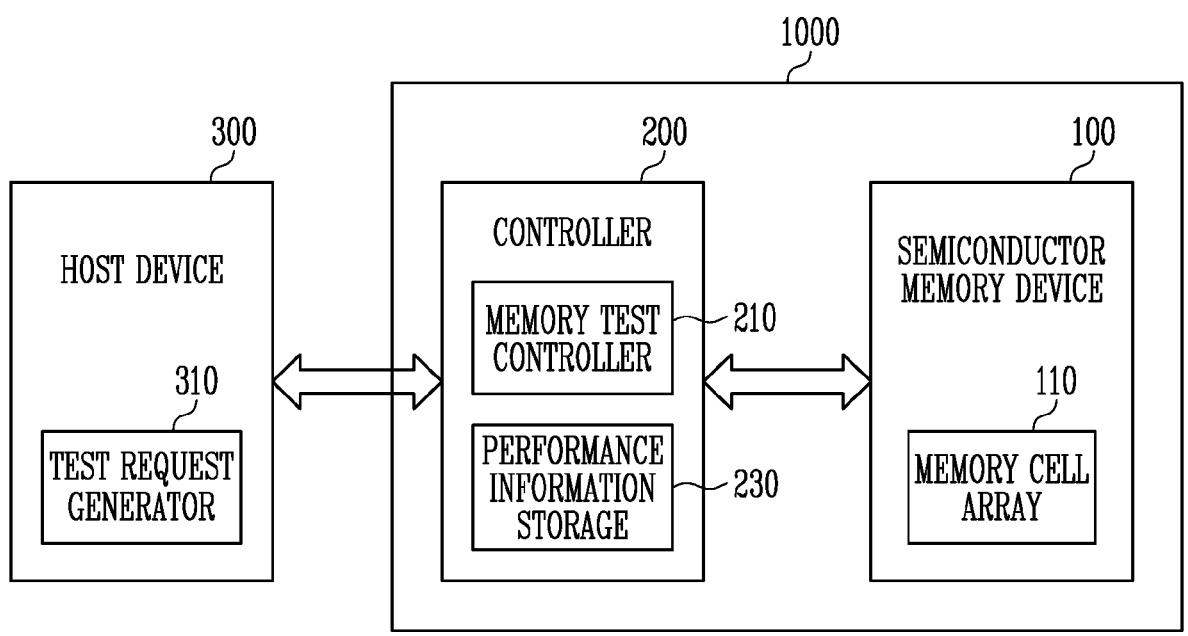
FIG. 1 is a block diagram illustrating a storage device including a controller, and a host device according to an embodiment of the present disclosure.

FIG. 1 is a block diagram illustrating a storage device 1000 including a controller 200, and a host device 300 according to an embodiment of the present disclosure.

Referring to FIG. 1, the storage device 1000 includes a semiconductor memory device 100 and a controller 200. In addition, the storage device 1000 communicates with an external device. In an embodiment, the external device may be the host device 300. In the present specification, the storage device 1000 communicates with the host device 300, but the present disclosure is not limited thereto. That is, in addition to the host device 300, other types of devices communicating with the storage device 1000 may also be included in the external device.

The controller 200 controls an overall operation of the semiconductor memory device 100. In addition, the controller 200 controls an operation of the semiconductor memory device 100 based on an operation request received from the host device 300.

The semiconductor memory device 100 operates under control of the controller 200. The semiconductor memory device 100 includes a memory cell array 110 having a plurality of memory blocks. In an embodiment, the semiconductor memory device 100 may be a flash memory device.

The controller 200 may receive a write request, a read request, a trim request, or the like from the host device 300, and control the semiconductor memory device 100 based on the received requests. More specifically, the controller 200 may generate commands for controlling the operation of the semiconductor memory device 100 and transmit the commands to the semiconductor memory device 100.

The semiconductor memory device 100 is configured to receive a command and an address from the controller 200 and to access an area selected by the address of the memory cell array. That is, the semiconductor memory device 100 performs an internal operation corresponding to a command on the area selected by the address.

For example, the semiconductor memory device 100 may perform a program operation, a read operation, and an erase operation. During the program operation, the semiconductor memory device 100 may program data in the area selected by the address. During the read operation, the semiconductor memory device 100 may read data from the area selected by the address. During the erase operation, the semiconductor memory device 100 may erase data stored in the area selected by the address.

The host device 300 includes a test request generator 310. The test request generator 310 may generate a test request for controlling the storage device 1000 to perform an internal test operation. The generated test request may be transmitted to the controller 200 of the storage device 1000. The controller 200 may control the semiconductor memory device 100 to perform a test operation on the memory cell array 110 of the semiconductor memory device 100 based on the received test request.

Furthermore, the controller 200 may store a test operation result of the semiconductor memory device 100.

As an example, the host device 300 may generate a self-test request. The self-test request is a request for controlling the storage device 1000 to independently perform the test operation without test equipment. The storage device 1000 may perform a self-test operation in response to the self-test request received from the host device 300. The self-test request for the storage device 1000 may be used for the following purposes.

a) Start a short self-test operation (short self-test)
b) Start an extended self-test operation (extended self-test)
c) Start a vendor specific self-test operation (vendor specific self-test)
d) Abort a self-test operation that is already in progress The self-test operation may be performed by the controller 200 of the storage device 1000. The self-test operation may be a diagnostic test sequence for testing integrity and functionality of the controller 200 and may include a media test related to a namespace. The self-test operation may be divided into a series of segments, and each segment may be configured of a set of vendor specific tests. A segment number of a "self-test result data structure" may be used for reporting purposes, for example, to display a failure when a test is failed. In the short self-test operation and the extended self-test operation, the tests performed in each segment may be the same.

According to that described in a basic specification of NVMe, as specified in Table 1 below, a namespace identifier field may control the namespace included in the self-test operation of the storage device 1000. In order to distinguish a command from the command transmitted from the controller 200 to the semiconductor memory device 100, a term "command" described in the NVMe is replaced with "request" in the present specification.

TABLE 1

| Value | Description |
|---|---|
| 00000000h | Specifies that the self-test operation does not include the namespace and only the controller is included as a portion of the self-test operation. |
| 00000001h~FFFFFFFEh | Specifies that the self-test operation includes the namespace specified in this field. When this field specifies an invalid namespace ID, the controller is required to abort the request with a status of an invalid namespace or format. When this field specifies an inactive namespace ID, the controller is required to abort the request with a status of an invalid field in the request. |
| FFFFFFFFh | Specifies that when the self-test operation is started, a device independent self-test |

TABLE 1-continued

| Value | Description |
|---|---|
| | operation includes all active namespaces accessible through the controller. |

As an example, as disclosed in Table 2 below, the self-test request may use a command Dword 10 field. In this case, all other command specific fields may be reserved.

TABLE 2

| Bits | Description |
|---|---|
| 31:04 | Reserved. |
| 03:00 | Self-test code (STC): This field specifies an operation performed by the self-test request. |

More specifically, the STC specified by the bits (03:00) of Table 2 is shown in Table 3 below.

TABLE 3

| Value | Definition |
|---|---|
| 0h | Reserved |
| 1h | Start the short self-test operation (short self-test) |
| 2h | Start the extended self-test operation (extended self-test) |
| 3h~Dh | Reserved |
| Eh | Vendor specific |
| Fh | Abort the self-test operation |

In an embodiment, according to that described in the basic specification of the NVMe, a method of processing a self-test command received according to an operation status of the storage device 1000 is defined in Table 4 below.

TABLE 4

| Self-test progress status | STC | Controller operation |
|---|---|---|
| Yes | 1h | Abort a new self-test request as a state in which |
| | 2h | the self-test operation is in progress. |
| | Eh | Vendor Specific. |
| | Fh | The controller sequentially performs the following operations. 1. Stop the self-test operation that is in progress 2. Generate a log entry in the "newest self-test result data structure" in a self-test log. 3. Set a "current device self-test status" field of a "device self-test log" to 0h 4. Successfully complete the request |
| No | 1h | The controller sequentially performs the following operations. 1. Check a parameter of the request 2. Set the "current device self-test status" field of the "device self-test log" to 1h 3. Start the self-test operation 4. Successfully complete the request |
| | 2h | The controller sequentially performs the following operations. 1. Check the parameter of the request 2. Set the "current device self-test status" field of the "device self-test log" to 2h 3. Start the self-test operation 4. Successfully complete the request |
| | Eh | Vendor specific. |
| | Fh | Successfully complete the request. The "device self-test log" is not corrected. |

The storage device 1000 may maintain a log page related to the self-test. For example, the storage device 1000 may have a log identifier of a log page "06h" related to the self-test, and may indicate the following.
  a) The status of the device independent self-test task that is in progress and a completion rate of the corresponding task.
  b) The last 20 self-test operation results.

The self-test result data structure included in the "newest self-test result data structure" field is always the result of the last completed or aborted self-test operation. The next self-test result data structure field includes the result of the second most recent self-test operation. For example, when less than 20 self-test tasks are completed or aborted, a self-test status field of an unused self-test result data structure field may be required to be set to Fh, and all other fields in the corresponding self-test result data structure are ignored. As an example, the self-test log may be configured as shown in Table 5 below.

TABLE 5

| Bytes | Description |
| --- | --- |
| 00 | Current self-test operation: This field defines the current self-test operation of the storage device. Bit 7:4 is reserved.<br>Bit 3:0 indicates the status of the current self-test operation as defined in Table 6 below. When the self-test operation is in progress (that is, this field is set to 1h or 2h), the controller is required not to set this field to 0h until the new self-test result data structure is generated (that is, when the self-test operation of the storage device 1000 is completed or aborted, the controller is required to generate the self-test result data structure before setting this field to 0h). |
| 01 | Current self-test completion: This field defines the completion status of the current self-test. Bit 7 is reserved.<br>Bit 6:0 indicates a percentage of the completed self-test operation (for example, a value of 25 indicates that 25% of the self-test operation is completed and 75% remains). When bit 3:0 of the current self-test operation field is vacated to 0h, indicating that the self-test operation that is in progress does not exist, this field is ignored. |
| 03:02 | Reserved |
| 31:04 | The newest self-test result data structure (refer to Table 7 below) |
| 59:32 | Second most recent self-test result data structure (refer to Table 7 below) |
| ... | ... |
| 535:508 | Nineteenth most recent self-test result data structure (refer to Table 7 below) |
| 563:536 | Twentieth most recent self-test result data structure (refer to Table 7 below) |

TABLE 6

| Value | Definition |
| --- | --- |
| 0h | The self-test operation that is in progress does not exist. |
| 1h | The short self-test operation is in progress. |
| 2h | The extended self-test operation is in progress. |
| 3h~Dh | Reserved |
| Eh | Vendor Specific |
| Fh | Reserved |

TABLE 7

| Bytes | Description |
| --- | --- |
| 00 | Self-test status: This field indicates the self-test code and the operation status. Bit 7:4 indicates a self-test code value specified in the self-test request starting the self-test operation described by this self-test result data structure (refer to Table 3).<br>Bit 3:0 indicates the result of the device independent self-test task described by this self-test result data structure (refer to Table 8). |
| 01 | Segment number: This field indicates a segment number where a first self-test failure occurs. This field is ignored when the self-test status field bit [3:0] is not set to 7h. |
| 02 | Valid diagnostic information: This field indicates reported diagnostic error information. Bit 3 (SC valid): When the bit 3 is set to '1', the bit 3 indicates that a content of the status code (SC) field is valid. When the bit 3 is vacated to '0', the bit 3 indicates that the content of the SC field is invalid.<br>Bit 2 (SCT valid): When the bit 2 is set to '1', the bit 2 indicates that a content of the status code type (SCT) field is valid. When the bit 2 is vacated to '0', the bit 2 indicates that the content of the SCT field is invalid.<br>Bit 1 (FLBA valid): When the bit 1 is set to '1', the bit 1 indicates that a content of a failed LBA (FLBA) field is valid. When the bit 1 is vacated to '0', the bit 1 indicates that the content of the FLBA field is invalid.<br>Bit 0 (NSID Valid): When the bit 0 is set to '1', the bit 0 indicates that a content of a namespace identifier (NSID) field is valid. When the bit 0 is vacated to '0', the bit 0 indicates that the content of the NSID field is invalid. |
| 03 | Reserved |
| 11:04 | Power on hours (POH): This field indicates a power-on time of the storage device 1000 when the self-test operation is completed or aborted. The POH does not include a time when power is supplied to the controller and the controller is in a low power status. |
| 15:12 | Namespace identifier (NSID): This field indicates the namespace in which a failed LBA occurs. A content of this field is only valid when an NSID valid bit is set to '1'. |
| 23:16 | Failing LBA (FLBA): This field indicates an LBA of a logical block that causes the test to be failed. When the device finds two or more failed logical blocks during the test, this field indicates only one of the failed logical blocks. A content of this field is only valid when the FLBA valid bit is set to '1'. |
| 24 | Status code type (SCT): This field may include additional information related to an error or a condition. Bit 7:3 is reserved. Bit 2:0 may include additional information related to the error or the condition generated during the self-test operation, displayed in the same format used in an SCT field of a completion queue entry. A content of this field is valid only when the SCT valid bit is set to '1'. |
| 25 | Status Code: This field may include additional information related to the error or the condition generated during the self-test operation, displayed in the same format used in the status code (SC) field of the completion queue entry. A content of this field is valid only when the SC valid bit is set to '1'. |
| 27:26 | Vendor specific |

TABLE 8

| Value | Definition |
| --- | --- |
| 0h | The task is completed without an error. |
| 1h | The operation is aborted due to the self-test request. |
| 2h | The operation is aborted due to a controller level reset. |
| 3h | The operation is aborted because the namespace is removed from a namespace inventory. |
| 4h | The operation is aborted due to processing of an NVM format request. |
| 5h | A fatal or unknown test error occurs while the controller performs the self-test operation, and the operation is not |

TABLE 8-continued

| Value | Definition |
|---|---|
| | completed. |
| 6h | The operation is completed, but a failed segment occurs, and the failed segment is unknown. |
| 7h | The operation is completed, but one or more failed segments occur, and the failed first segment is displayed in the segment number field. |
| 8h | The task is aborted due to an unknown reason. |
| 9h | The task is aborted due to a sanitize task. |
| Ah~Eh | Reserved |
| Fh | The entry is not used (the test result is not included) |

The self-test operation may be performed in a background. Accordingly, the self-test operation may be processed simultaneously with some requests, and the self-test operation may be required to be aborted to process another request.

When receiving a request to temporarily abort the self-test operation during the self-test operation, the controller 200 aborts the self-test operation, processes and completes an operation related to the received request, and then resumes the self-test operation. During the self-test operation, performance of a subsystem of the storage device 1000 may be degraded.

As an example, the short self-test operation is required to be completed within 2 minutes. A completion rate of the short self-test operation may be displayed in a current completion rate field of a self-test log (refer to Table 5).

An abortion condition of the simple self-test operation is as follows.
 a) The self-test operation is required to be aborted by a controller level reset affecting the performed controller.
 b) The self-test operation is required to be aborted by an NVM format command.
 c) The self-test operation is required to be aborted when a sanitize operation is started.
 d) The self-test operation is required to be aborted when a self-test request in which the self-test code field is set to Fh is processed.
 e) The self-test operation may be aborted when a designated namespace is removed from the namespace inventory.

The extended self-test operation is required to be completed within a time displayed in an "extended self-test time" field of a "controller identify controller" data structure. The completion rate of the extended self-test operation may be displayed in a current completion rate field of the self-test log (refer to Table 5).

The extended self-test operation is required to persist also in a case where all controller level resets exist and is required to be restarted after the reset is completed or power recovery exists.

An abortion condition of the extensive self-test operation is as follows.
 a) The extended self-test operation is required to be aborted by the NVM format command.
 b) The extended self-test operation is required to be aborted when the sanitize operation is started.
 c) The extended self-test operation is required to be aborted when a self-test request in which the self-test code field is set to Fh is processed.
 d) The extended self-test operation may be aborted when the designated namespace is removed from the namespace inventory.

From a viewpoint of the controller 200, the test operation is an operation for measuring performance of the semiconductor memory device 100. Moreover, from a viewpoint of the host device 300, the test operation is an operation for measuring performance of the storage device 1000 including the controller 200 and the semiconductor memory device 100. Therefore, when the controller 200 transmits the test operation result of the semiconductor memory device 100 to the host device 300, the host device 300 may recognize the test operation result as the performance of the storage device 1000.

More specifically, the controller 200 includes a memory test controller 210 and a performance information storage 230. The memory test controller 210 receives the test request generated by the test request generator 310 of the host device 300. The memory test controller 210 controls the test operation of the semiconductor memory device 100 based on the received test request. More specifically, the memory test controller 210 may generate at least one command for controlling the semiconductor memory device 100 to perform the test operation. The command generated by the memory test controller 210 is transmitted to the semiconductor memory device 100. The semiconductor memory device 100 may perform the test operation in response to the received command.

The performance information storage 230 may store a test operation result of the semiconductor memory device 100 as performance information.

In a case of the present disclosure, an independent performance test may be performed inside the storage device 1000 and a performance result of the performance test may be stored. For example, the storage device 1000 may perform the performance test operation based on the test request from the host device 300. In this case, the storage device 1000 may perform a specific test operation based on a parameter included in the test request. The parameter included in the test request may include a type of the test operation, a range of a test target, and the like.

The storage device 1000 may store performance information including a plurality of performance test operation results. The performance information may include a plurality of performance information entries. Each performance information entry corresponds to result information of each performed test operation. In this case, each performance information entry may include a serial number of the performed test operation, the type of the performed test operation, the range of the target on which the test operation is performed, and the result of the test operation. A detailed configuration of the performance information entry is described with reference to FIG. 10.

In a method described above, the storage device 1000 may accumulate and store the results of the test operation corresponding to the test request received from the host device 300. That is, the storage device 1000 may store the results of a plurality of test operations. Moreover, the storage device 1000 may transmit the stored result of the test operation to the host device 300 in response to a request from the host device 300. In this case, the result of the plurality of test operations may be transmitted to the host device 300 as the performance information. Accordingly, the host device 300 may recognize the status of the storage device 1000 through the performance information of the storage device 1000 and perform a subsequent operation. For example, when it is determined that the performance of the storage device is degraded through the performance information received from the storage device 1000, the host device 300 may display this to a user as a notification. As another example, when it is determined that the performance of the storage device is degraded through the performance information received from the storage device 1000, at least a portion of data stored in the storage device 1000 may be backed up to another storage device.

Figure 2:
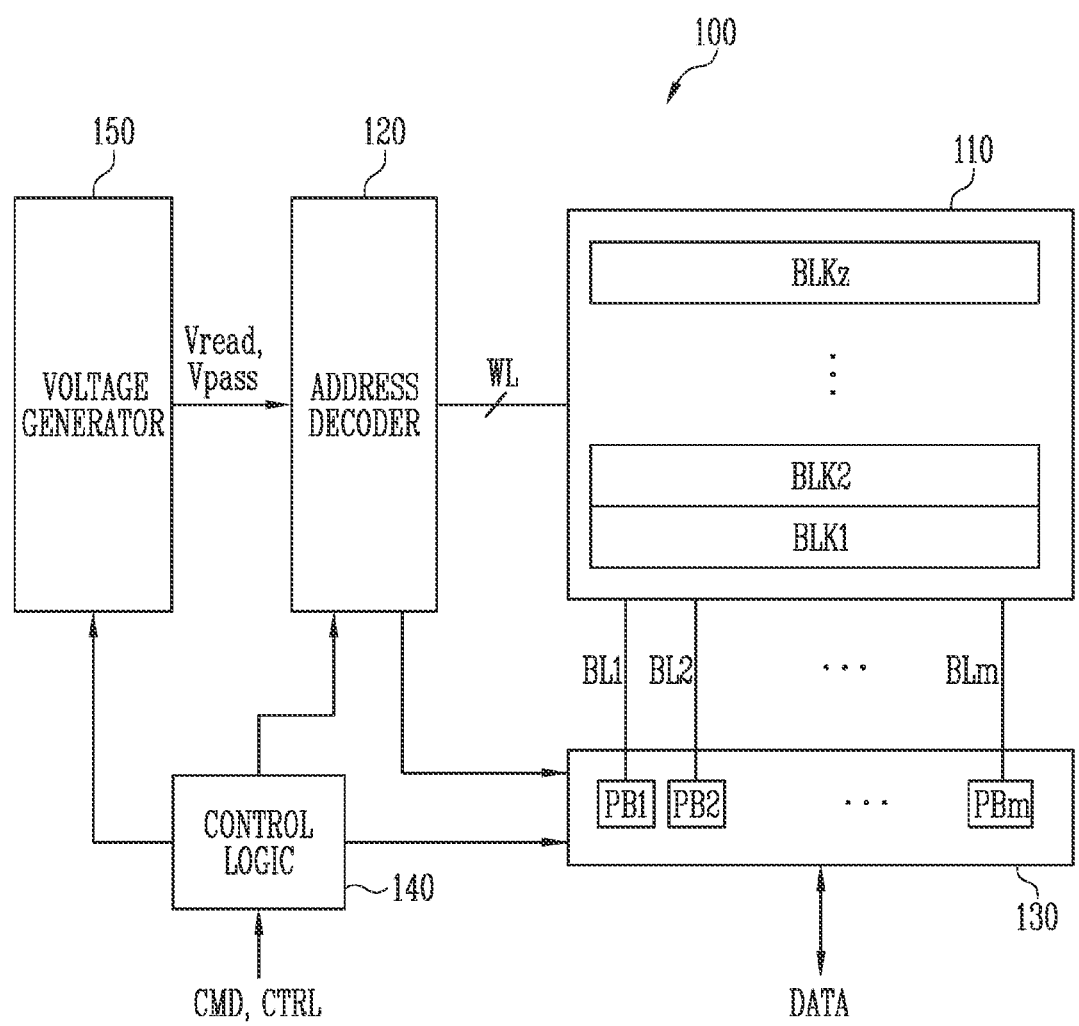
FIG. 2 is a block diagram illustrating a semiconductor memory device of FIG. 1 according to an embodiment of the present disclosure.

FIG. 2 is a block diagram illustrating the semiconductor memory device of FIG. 1 according to an embodiment of the present disclosure.

Referring to FIG. 2, the semiconductor memory device 100 includes a memory cell array 110, an address decoder 120, a read and write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block at a read voltage application operation during a read operation, and applies a pass voltage Vpass to the remaining unselected word lines. In addition, the address decoder 120 applies a verify voltage generated by the voltage generator 150 to the selected word line among the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs the read operation, the write operation, and an erase operation on the memory cell array 110. The peripheral circuit performs the read operation, the write operation, and the erase operation on the memory cell array 110 based on the control of the control logic 140.

Figure 3:
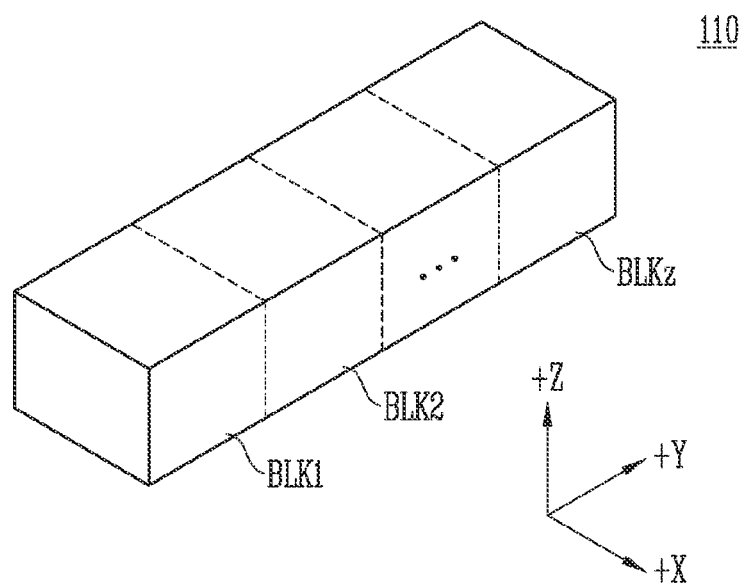
FIG. 3 is a diagram illustrating a memory cell array of FIG. 2 according to an embodiment of the present disclosure.

FIG. 3 is a diagram illustrating a memory cell array of FIG. 2 according to an embodiment of the present disclosure.

Figure 4:
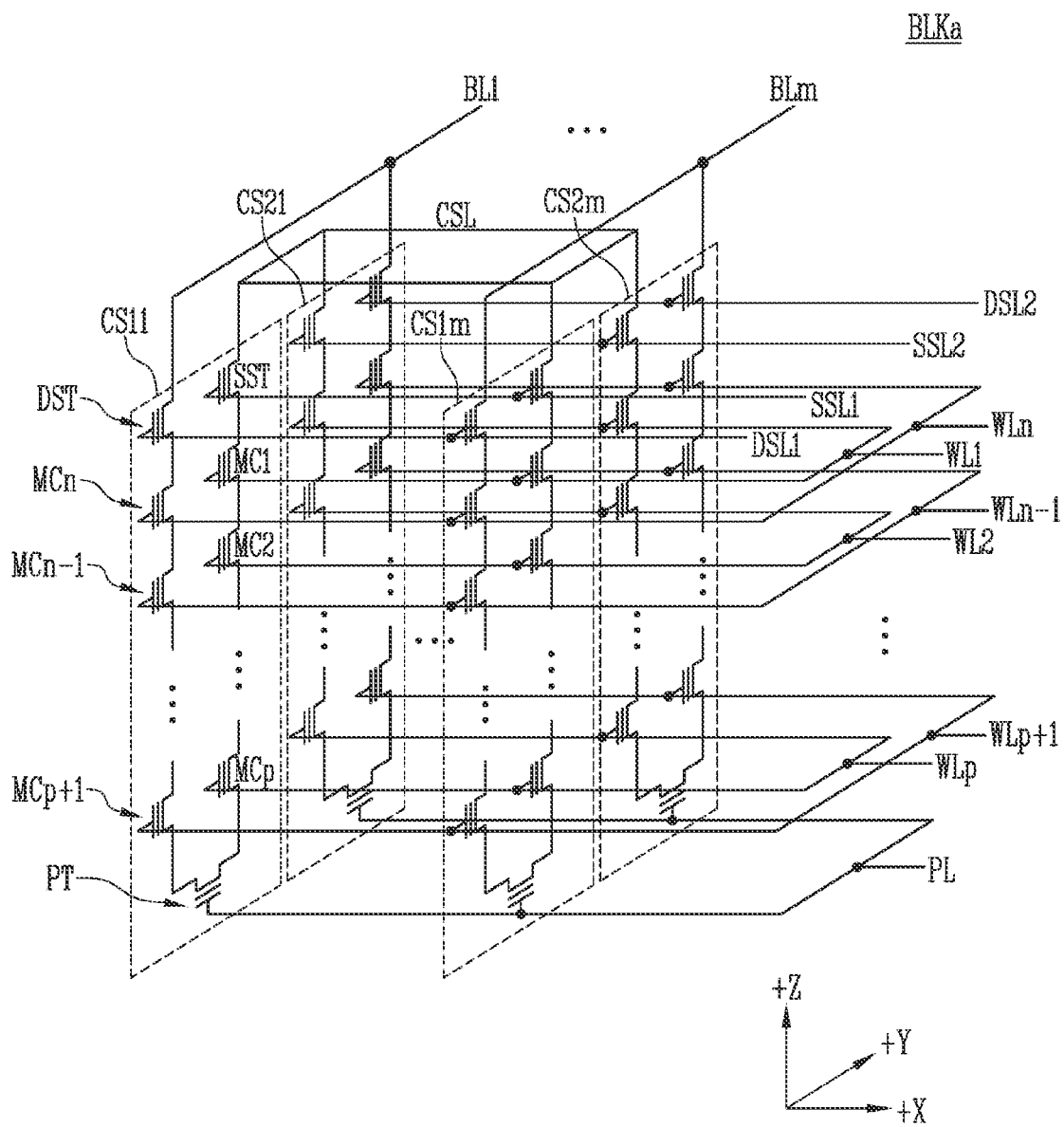
FIG. 4 is a circuit diagram illustrating a memory block BLKa among memory blocks BLK1 to BLKz of FIG. 3 according to an embodiment of the present disclosure.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 4 and 5. FIG. 4 is a circuit diagram illustrating a memory block BLKa among the memory blocks BLK1 to BLKz of FIG. 3 according to an embodiment of the present disclosure.

Referring to FIG. 4, the memory block BLKa includes a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction, that is, the +X direction. In FIG. 4, two cell strings are arranged in a column direction, that is, the +Y direction. However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. Cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting one of the drain select lines DSL1 and DSL2. One page of the selected cell strings may be selected by selecting one of the word lines WL1 to WLn.

In another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to the even bit lines, and odd-numbered cell strings among the cell strings CS11 to CS1m or CS21 to CS2m arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less dummy memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
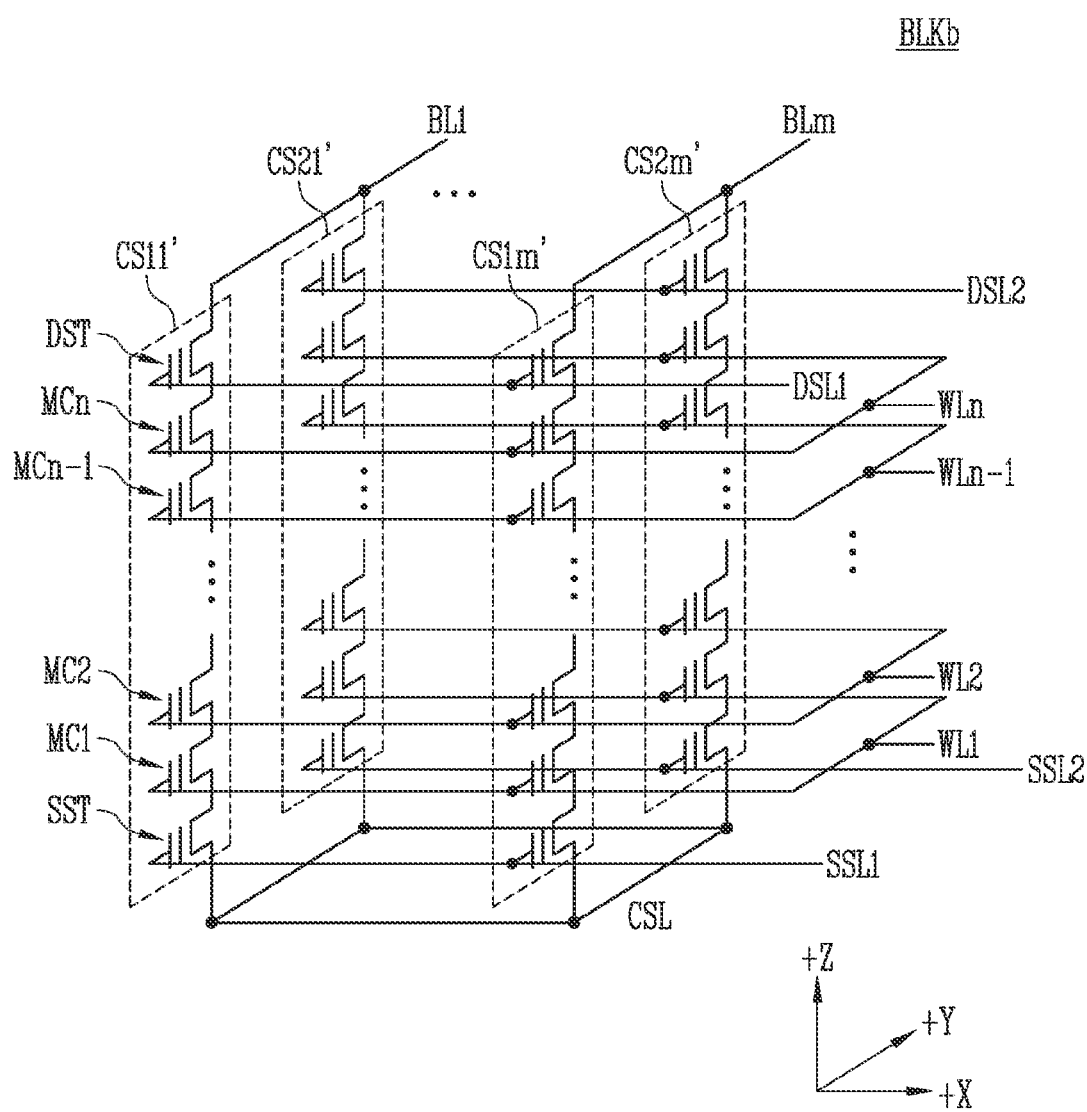
FIG. 5 is a circuit diagram illustrating a memory block BLKb among the memory blocks BLK1 to BLKz of FIG. 3 according to an embodiment of the present disclosure.

FIG. 5 is a circuit diagram illustrating a memory block BLKb among the memory blocks BLK1 to BLKz of FIG. 3 according to an embodiment of the present disclosure.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
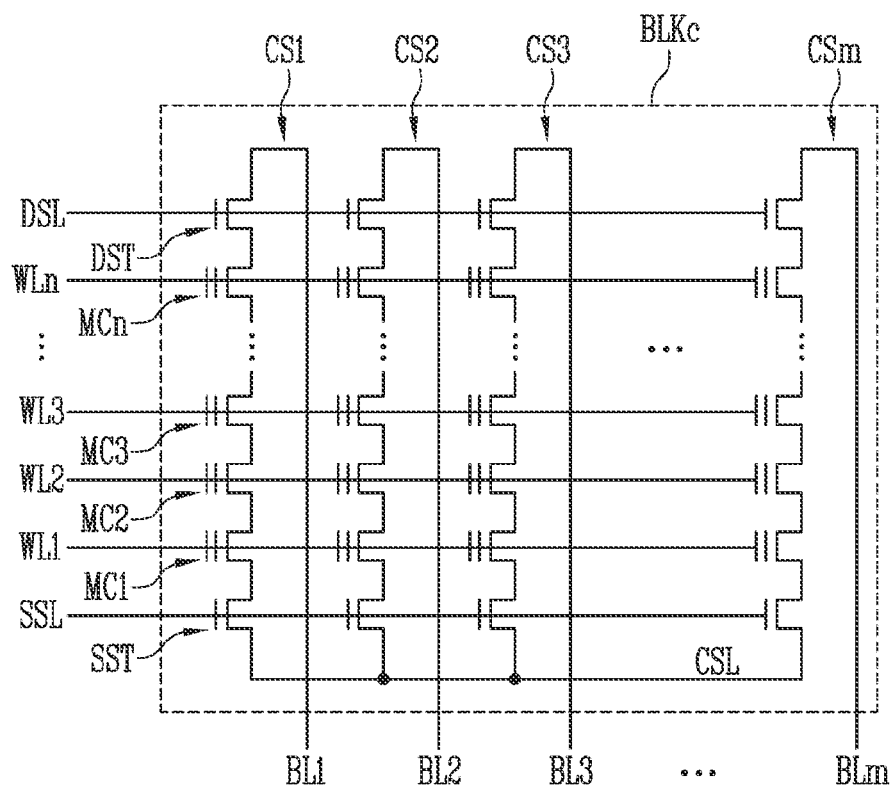
FIG. 6 is a circuit diagram illustrating a memory block BLKc among the plurality of memory blocks BLK1 to BLKz included in the memory cell array 110 of FIG. 2 according to an embodiment of the present disclosure.

FIG. 6 is a circuit diagram illustrating a memory block BLKc among the plurality of memory blocks BLK1 to BLKz included in the memory cell array 110 of FIG. 2, according to an embodiment of the present disclosure.

Referring to FIG. 6, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 7:
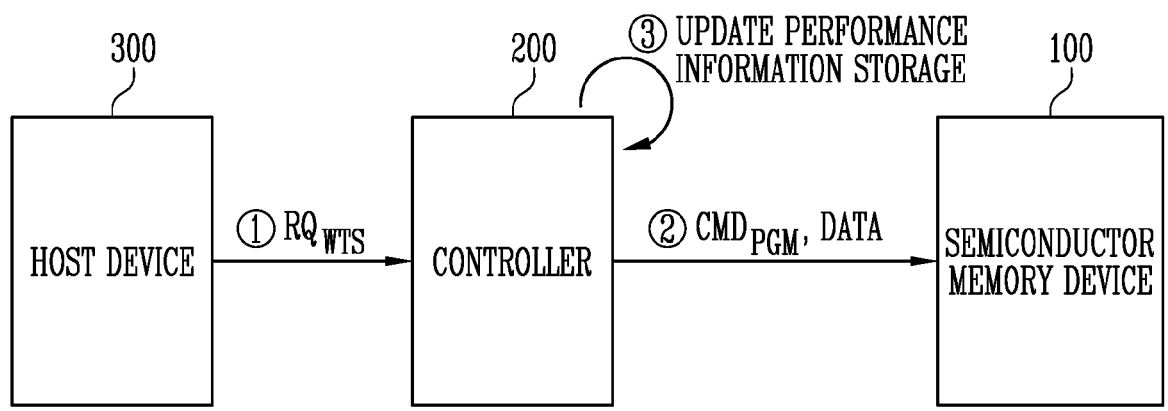
FIG. 7 is a diagram illustrating the controller of FIG. 1 that controls a test operation of the semiconductor memory device according to an embodiment of the present disclosure.

FIG. 7 is a diagram illustrating the controller of FIG. 1 that controls the test operation of the semiconductor memory device according to an embodiment of the present disclosure. A controller that controls a write test operation of the semiconductor memory device is described with reference to FIG. 7.

Referring to FIG. 7, first, the host device 300 transmits a write test request $RQ_{WTS}$ to the controller 200 of the storage device (①). The host device 300 may determine that the storage device performs a write test operation as necessary. In this case, the test request generator 310 of the host device 300 may generate the write test request $RQ_{WTS}$. The write test request $RQ_{WTS}$ may include information on a target range of the write test operation to be performed by the storage device. For example, the host device 300 may determine to perform a write test operation on 1 megabyte (MB) of a storage area included in the storage device. In this case, the write test request $RQ_{WTS}$ may include information indicating that a performance range of the write test operation is 1 MB.

The controller 200 may generate a program command $CMD_{PGM}$ based on the received write test request $RQ_{WTS}$. More specifically, in response to the write test request $RQ_{WTS}$, the memory test controller 210 of the controller 200 may generate the program command $CMD_{PGM}$ corresponding to the target range of the write test operation included in the write test request $RQ_{WTS}$. That is, when the write test request $RQ_{WTS}$ includes information indicating that the performance range of the write test operation is 1 MB, the memory test controller 210 may generate the program command $CMD_{PGM}$ for programming data of 1 MB of the storage area of the memory cell array included in the semiconductor memory device 100.

The controller 200 may transmit the generated program command $CMD_{PGM}$ to the semiconductor memory device 100 (②). Together with the program command $CMD_{PGM}$, the controller 200 may transmit program data DATA to the semiconductor memory device 100. In this case, the program data DATA may be data received from the host device 300 for the write test operation. The host device 300 may transmit specific data to the controller 200 together with the write test request $RQ_{WTS}$.

In another embodiment, the program data DATA may not be data transmitted from the host, but may be data generated in the storage device 1000. Therefore, the controller 200 may transmit arbitrary data to the semiconductor memory device 100 as the program data DATA together with the program command $CMD_{PGM}$. In an embodiment, the program data DATA transmitted to the semiconductor memory device 100 together with the program command $CMD_{PGM}$ may be dummy data arbitrarily generated by the memory test controller 210. In another embodiment, the program data DATA transmitted to the semiconductor memory device 100 together with the program command $CMD_{PGM}$ may be cache data cached in the controller 200.

More specifically, the controller 200 may include a write cache or a read cache. The write cache may be a cache that stores data received together with the write request from the host device 300. In an embodiment, the controller 200 may transmit the data stored in the write cache to the semiconductor memory device 100 together with the program command $CMD_{PGM}$ as the program data DATA for the write test operation. As an example, the controller 200 may transmit the most recently stored data among the data stored in the write cache as the program data DATA to the semiconductor memory device 100 together with the program command $CMD_{PGM}$.

The read cache may be a cache that stores data read from the semiconductor memory device 100 in response to the read request from the host device 300. In an embodiment, the controller 200 may transmit the data stored in the read cache to the semiconductor memory device 100 together with the program command $CMD_{PGM}$ as the program data DATA for the write test operation. As an example, the controller 200 may transmit the most recently stored data among the data stored in the read cache as the program data DATA to the semiconductor memory device 100 together with the program command CMD PGM.

In response to the received program command CMD PGM, the semiconductor memory device 100 performs the program operation. When the program operation of the semiconductor memory device 100 is completed, the controller 200 may determine a time taken for the semiconductor memory device 100 to perform the program operation. The controller 200 may store the time taken to perform the program operation in the performance information storage (3). In this case, a time taken to perform a write operation of a specific range may correspond to the performance information of the storage device 1000. The controller 200 may store the time taken to perform the program operation in the performance information storage 230 as the performance information on the write operation of the storage device 1000.

Figure 8:
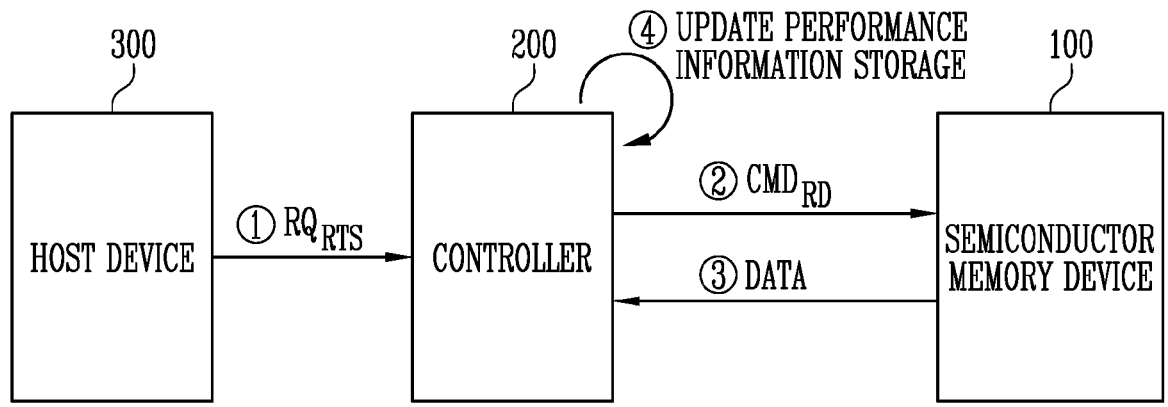
FIG. 8 is another diagram illustrating the controller of FIG. 1 that controls the test operation of the semiconductor memory device according to an embodiment of the present disclosure.

FIG. 8 is another diagram illustrating the controller of FIG. 1 that controls the test operation of the semiconductor memory device according to an embodiment of the present disclosure. A controller that controls a read test operation of the semiconductor memory device is described with reference to FIG. 8.

Referring to FIG. 8, first, the host device 300 transmits a read test request $RQ_{RTS}$ to the controller 200 of the storage device (①). The host device 300 may determine that the storage device performs a read test operation as necessary. In this case, the test request generator 310 of the host device 300 may generate the read test request $RQ_{RTS}$. The read test request $RQ_{RTS}$ may include information related to a target range of the read test operation to be performed by the storage device. For example, the host device 300 may determine to perform a read test operation on 5 MB of the storage area included in the storage device. In this case, the read test request $RQ_{RTS}$ may include information indicating that a performance range of the read test operation is 5 MB.

The controller 200 may generate a read command $CMD_{RD}$ based on the received read test request $RQ_{RTS}$. More specifically, in response to the read test request $RQ_{RTS}$, the memory test controller 210 of the controller 200 may generate the read command $CMD_{RD}$ corresponding to the target range of the read test operation included in the read test request $RQ_{RTS}$. That is, when the read test request $RQ_{RTS}$ includes information indicating that the performance range of the read test operation is 5 MB, the memory test controller 210 may generate the read command $CMD_{RD}$ for reading data of 5 MB of the storage area of the memory cell array included in the semiconductor memory device 100.

The controller 200 may transmit the generated read command $CMD_{RD}$ to the semiconductor memory device 100 (②). Together with the read command $CMD_{RD}$, the controller 200 may transmit a read address to the semiconductor memory device 100. The read address may be a physical address arbitrarily selected for the read test. That is, the controller 200 may transmit the arbitrary read address to the semiconductor memory device 100 together with the read command $CMD_{RD}$.

In response to the received read command $CMD_{RD}$, the semiconductor memory device 100 performs the read operation. The semiconductor memory device 100 may transmit the read data DATA to the controller 200 (③). As described above, when the read operation of the semiconductor memory device 100 is completed, the controller 200 may determine a time taken for the semiconductor memory device 100 to perform the read operation. The controller 200 may store the time taken to perform the read operation in the performance information storage (4). In this case, a time taken to perform a read operation of a specific range may correspond to the performance information of the storage device 1000. The controller 200 may store the time taken to perform the read operation in the performance information storage 230 as the performance information on the read operation of the storage device 1000.

Figures 9, 10:
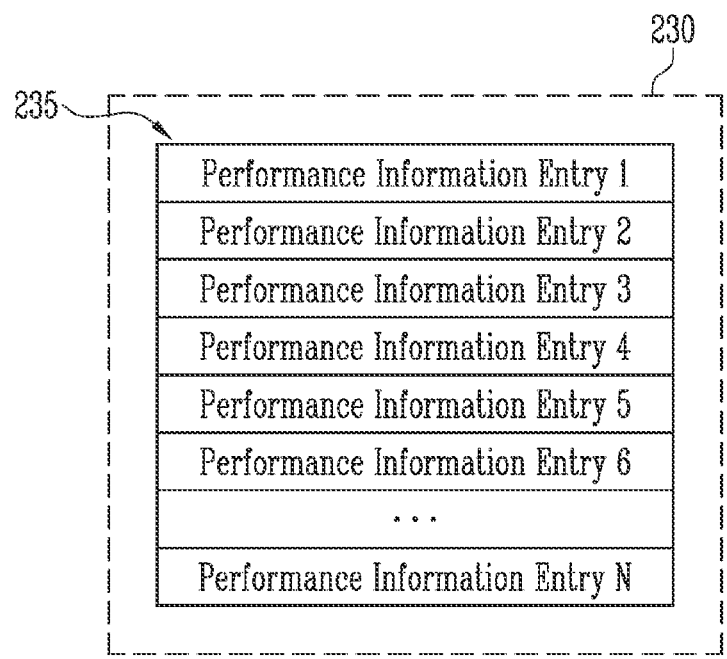
FIG. 9 is a diagram illustrating performance information stored in a performance information storage according to an embodiment of the present disclosure.
FIG. 10 is a diagram illustrating a configuration of an entry included in performance information according to an embodiment of the present disclosure.

FIG. 9 is a diagram illustrating the performance information stored in the performance information storage according to an embodiment of the present disclosure.

Referring to FIG. 9, the performance information storage 230 may store performance information 235. The performance information storage 230 may be included in the controller 200 and may be configured as a volatile memory device or a nonvolatile memory device.

As shown in FIG. 9, the performance information 235 according to an embodiment may include a plurality of performance information entries. One performance information entry may include a result according to one test operation. In FIG. 9, the performance information 235 includes N performance information entries. As a storage space of the performance information storage 230 increases, N may become a relatively large value. As the storage space of the performance information storage 230 decreases, N may become a relatively small value. Hereinafter, the performance information entry included in the performance information 235 is described in more detail with reference to FIGS. 10 and 11A to 11E.

FIG. 10 is a diagram illustrating a configuration of an entry included in the performance information according to an embodiment of the present disclosure.

Referring to FIG. 10, one performance information entry may include four fields. A first field may indicate a serial number of the test operation. A second field may indicate the type of test operation. For example, the write test or the read test corresponds to one of the type of the test operation. A third field may indicate the test target range. As in the above-described example, the test target range may mean a data size of the target on which the test operation is performed. A fourth field may indicate the test result. For example, when the test type is the write test, the test result may indicate the time taken to perform the write operation on the test target range. As another example, when the test type is the read test, the test result may indicate the time taken to perform the read operation on the test target range.

Hereinafter, a method in which the performance information is updated as the test operation is repeatedly performed is described with reference to FIGS. 11A to 11E.

FIGS. 11A to 11E are diagrams illustrating an update of the performance information storage according to an embodiment of the present disclosure.

Referring to FIG. 11A, a method of updating the performance information storage when the test operation on the storage device 1000 is first performed is shown. For example, the host device 300 may generate the read test request $RQ_{RTS}$ requesting to perform the read test for the target range of 1 MB. The storage device 1000 may perform the read operation on the arbitrarily set range of 1 MB, in response to the read test request $RQ_{RTS}$. When the read operation is completed, a time T1 taken for the read operation may be measured. The controller 200 of the storage device 1000 may generate a performance information entry corresponding to the first test operation and store the performance information entry in the performance information storage 230. Accordingly, performance information 235a as shown in FIG. 11A is generated, and the generated performance information 235a is stored in the performance information storage 230. At this time, the performance information 235a may include one performance information entry.

Thereafter, the host device 300 may generate the write test request $RQ_{WTS}$ requesting to perform the write test on the target range of 1 MB. The storage device 1000 may perform the write operation on the arbitrary generated data of a size of 1 MB, in response to the write test request $RQ_{WTS}$. When the write operation of the data is completed, a time T2 taken for the write operation may be measured. The controller 200 of the storage device 1000 may generate a performance information entry corresponding to the second test operation and store the performance information entry in the performance information storage 230. Accordingly, performance information 235b as shown in FIG. 11B is generated, and the generated performance information 235b is stored in the performance information storage 230. At this time, the performance information 235b may include two performance information entries.

Thereafter, the host device 300 may generate the read test request $RQ_{RTS}$ requesting to perform the read test on the target range of 5 MB. The storage device 1000 may perform the read operation on the arbitrarily set range of 5 MB, in response to the read test request $RQ_{RTS}$. When the read operation is completed, a time T3 taken for the read operation may be measured. The controller 200 of the storage device 1000 may generate a performance information entry corresponding to the third test operation and store the performance information entry in the performance information storage 230. Accordingly, performance information 235c as shown in FIG. 11C is generated, and the generated performance information 235c is stored in the performance information storage 230. At this time, the performance information 235c may include three performance information entries.

In a method described above, whenever the host device 300 transmits the test request to the storage device 1000, the storage device may perform the test operation corresponding to the received test request, and update the performance result of the test operation in the performance information storage 230. FIG. 11D shows the performance information 235d generated as a result of performing 10 test operations.

When the performance information storage 230 includes a storage space capable of storing 10 performance information entries, one of the 10 performance information entries which are already stored is required to be deleted in order to store an eleventh performance information entry. In this case, as shown in FIG. 11E, the performance information entry related to the longest performed first test operation may be excluded from performance information 235e, and the performance information entry generated as a result of an eleventh test operation may be included in the performance information 235e. In a similar method, when a twelfth test operation is performed, the performance information entry related to the second test operation may be excluded from the performance information, and a performance information entry generated as a result of the twelfth test operation may be included in the performance information. In this case, the performance information stored in the performance information storage 230 may include performance information entries generated as a result of the most recently performed 10 test operations.

As described above, from the viewpoint of the controller 200, the test operation is the operation for measuring the performance of the semiconductor memory device 100. Accordingly, the performance information stored in the performance information storage 230 may be information indicating the operation performance of the semiconductor memory device 100. Moreover, from the viewpoint of the host device 300, the test operation is the operation for measuring the performance of the storage device 1000 including the controller 200 and the semiconductor memory device 100. When the performance information stored in the performance information storage 230 is transmitted to the host device 300, the host device 300 may recognize the performance information as information indicating the performance of the storage device 1000.

Figure 12:
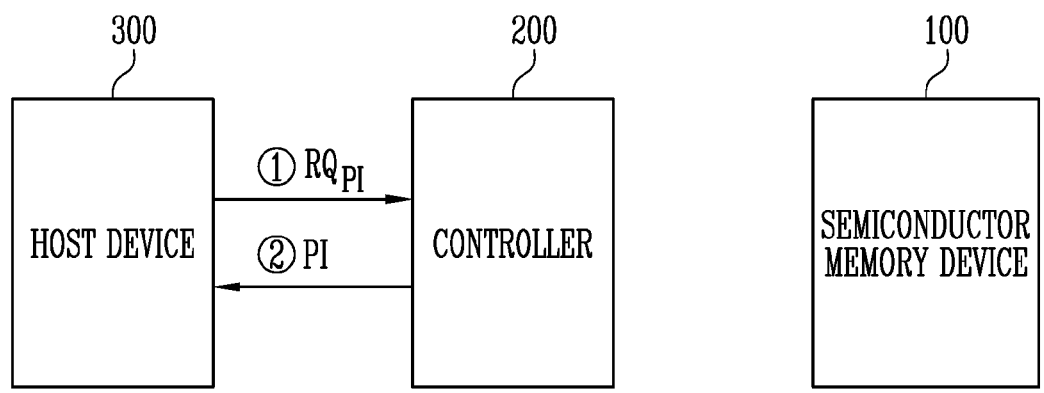
FIG. 12 is a diagram illustrating an operation of the controller of FIG. 1 that provides the performance information in response to a request from the host device according to an embodiment of the present disclosure.

FIG. 12 is a diagram illustrating an operation of the controller of FIG. 1 that provides the performance information in response to the request from the host device according to an embodiment of the present disclosure.

The host device 300 may require the performance information stored in the performance information storage 230 at a specific time point. In this case, the host device 300 may generate a performance information request $RQ_{PI}$ and transmit the generated performance information request $RQ_{PI}$ to the storage device 1000 (①).

The controller 200 of the storage device 1000 may transmit performance information PI stored in the performance information storage 230 to the host device 300, in response to the received performance information request $RQ_{PR}$ (②). As described above, the host device 300 may recognize the performance information PI received from the controller 200 as information indicating the performance of the storage device 1000.

Figure 13:
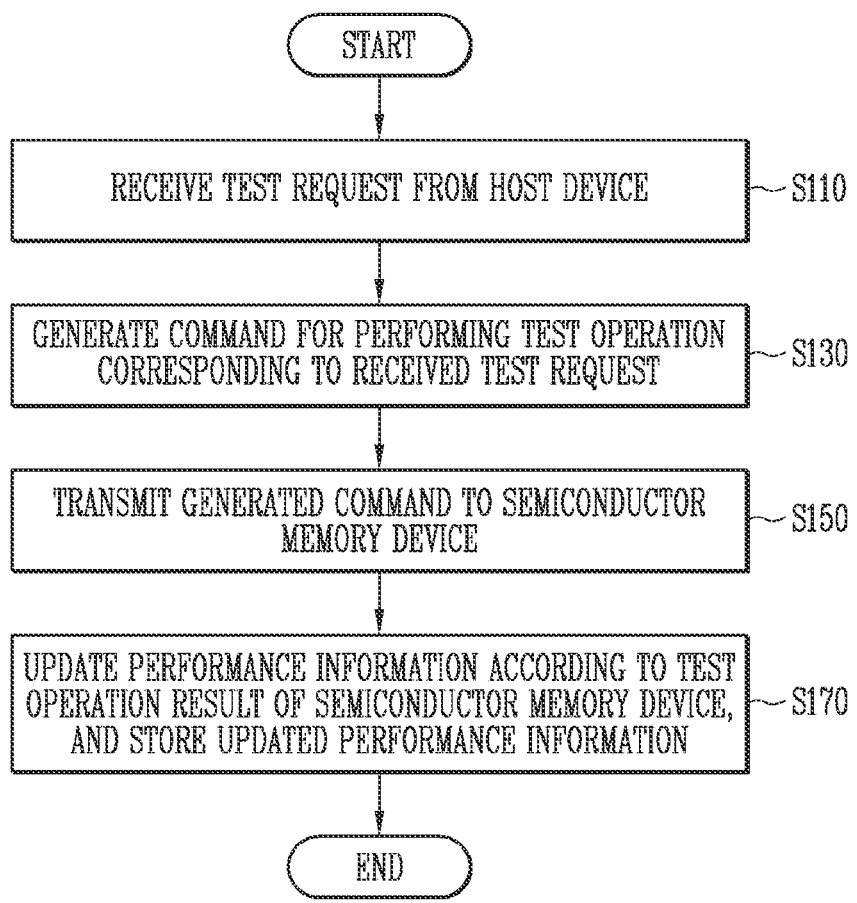
FIG. 13 is a flowchart illustrating a method of operating a controller according to an embodiment of the present disclosure.

FIG. 13 is a flowchart illustrating a method of operating a controller according to an embodiment of the present disclosure. Referring to FIG. 13, the method of operating the controller according to an embodiment of the present disclosure includes receiving the test request from the host device 300 (S110), generating a command for performing the test operation corresponding to the received test request (S130), transmitting the generated command to the semiconductor memory device (S150), updating the performance information according to the test operation result of the semiconductor memory device, and storing the updated performance information (S170).

In operation S110, the controller 200 may receive the test request from the host device 300. The test request may be the write test request $RQ_{WTS}$ or the read test request $RQ_{RTS}$.

In operation S130, the memory test controller 210 of the controller 200 may generate a command for controlling the semiconductor memory device 100 to perform the test operation corresponding to the received test request. When the test request received in operation S110 is the write test request $RQ_{WTS}$, the command generated in operation S130 may be the program command $CMD_{PGM}$. When the test request received in operation S110 is the read test request $RQ_{RTS}$, the command generated in operation S130 may be the read command $CMD_{RD}$.

In operation S150, the controller 200 transmits the generated command to the semiconductor memory device 100. Accordingly, the semiconductor memory device 100 may perform the operation corresponding to the received command. When the operation of the semiconductor memory device 100 is completed, in operation S170, the controller 200 updates the performance information based on a result of the test operation of the semiconductor memory device. That is, the controller 200 may generate the performance information entry corresponding to the received test request. Furthermore, the controller 200 may update the performance information to include the generated performance information entry into the performance information, and store the updated performance information in the performance information storage 230.

Figure 14:
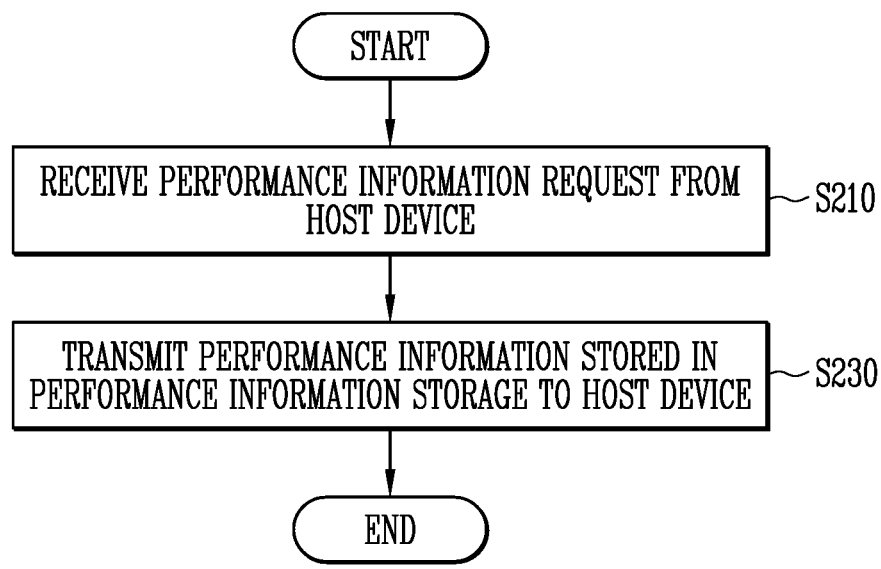
FIG. 14 is a flowchart illustrating a method of operating the controller that provides the performance information in response to the request of the host device according to an embodiment of the present disclosure.

FIG. 14 is a flowchart illustrating a method of operating the controller that provides the performance information in response to the request of the host device according to an embodiment of the present disclosure.

Referring to FIG. 14, the method of operating the controller 200 includes receiving the performance information request $RQ_{PI}$ from the host device 300 (S210) and transmitting the performance information stored in the performance information storage 230 to the host device (S230).

Referring to FIGS. 13 and 14, the controller 200 according to an embodiment of the present disclosure may control the storage device 1000 to perform the test operation according to the request from the host device 300, and store the test result as the performance information of the storage device 1000. When the performance information request from the host device 300 exists, the controller 200 may provide the up-to-date performance information to the host device 300.

Figure 15:
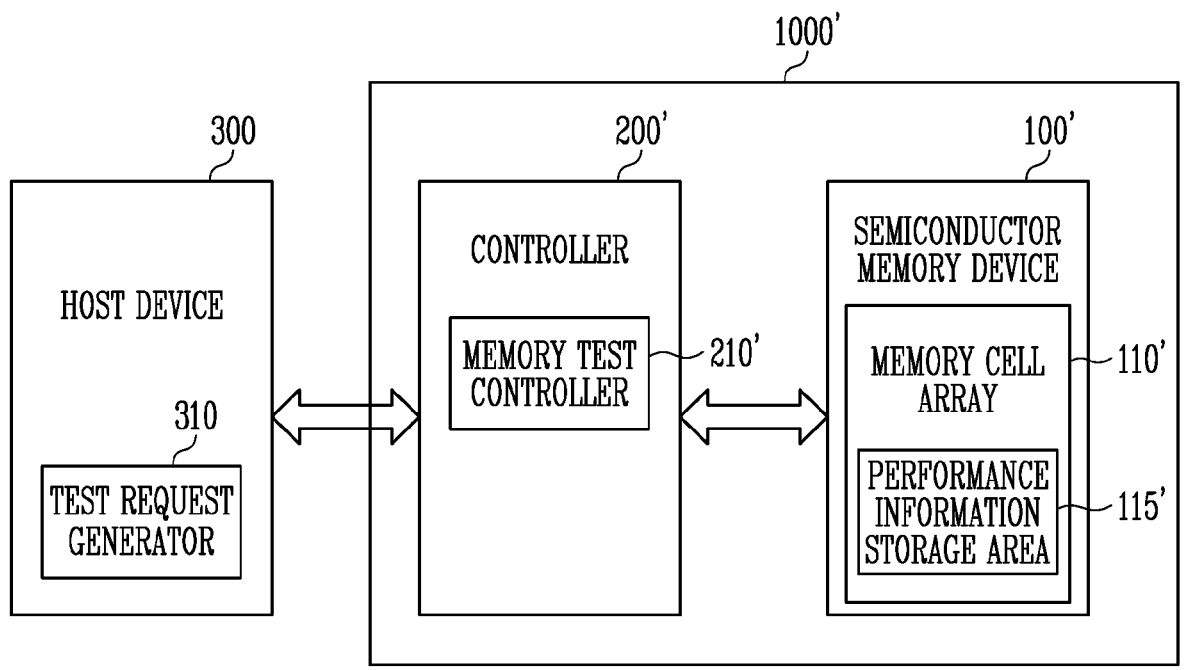
FIG. 15 is a block diagram illustrating a storage device including a controller, and a host device according to another embodiment of the present disclosure.

FIG. 15 is a block diagram illustrating a storage device including a controller, and a host device according to another embodiment of the present disclosure.

Referring to FIG. 15, the storage device 1000' includes a semiconductor memory device 100' and the controller 200'. In addition, the storage device 1000' communicates with the host device 300. The controller 200' controls an overall operation of the semiconductor memory device 100'. In addition, the controller 200' controls an operation of the semiconductor memory device 100' based on an operation request received from the host device 300.

The semiconductor memory device 100' operates under control of the controller 200'. The semiconductor memory device 100' includes a memory cell array 110' having a plurality of memory blocks. In an embodiment, the semiconductor memory device 100' may be a flash memory device. The memory cell array 110' of the semiconductor memory device 100' may include a performance information storage area 115'.

The controller 200' may receive a write request, a read request, a trim request, or the like from the host device 300, and control the semiconductor memory device 100' based on the received requests. More specifically, the controller 200' may generate commands for controlling the operation of the semiconductor memory device 100' and transmit the commands to the semiconductor memory device 100'.

The semiconductor memory device 100' is configured to receive a command and an address from the controller 200' and to access an area selected by the address of the memory cell array. That is, the semiconductor memory device 100' performs an internal operation corresponding to a command on the area selected by the address.

The host device 300 includes the test request generator 310. The test request generator 310 may generate the test request for controlling the storage device 1000' to perform the internal test operation. The generated test request may be transmitted to the controller 200' of the storage device 1000'. The controller 200' may control the semiconductor memory device 100' to perform the test operation on the memory cell array 110' of the semiconductor memory device 100' based on the received test request.

The controller 200' may control the semiconductor memory device 100' to store the test operation result of the semiconductor memory device 100' in the performance information storage area 115'.

More specifically, the controller 200' includes a memory test controller 210'. The memory test controller 210' receives the test request generated by the test request generator 310 of the host device 300. The memory test controller 210' controls the test operation of the semiconductor memory device 100' based on the received test request. More specifically, the memory test controller 210' may generate at least one command for controlling the semiconductor memory device 100' to perform the test operation. The command generated by the memory test controller 210' is transmitted to the semiconductor memory device 100'. The semiconductor memory device 100' may perform the test operation in response to the received command.

After the test operation of the semiconductor memory device 100', the controller 200' may update the performance information based on the test operation result of the semiconductor memory device 100'. In addition, the controller 200' may control the semiconductor memory device 100' to program the updated performance information in the performance storage area 115'.

Referring to FIG. 1, the controller 200 of the storage device 1000 is configured to store the performance information in the performance information storage 230 included in the controller 200. On the other hand, the controller 200' shown in FIG. 15 controls the semiconductor memory device 100' to store the performance information in the performance information storage area 115' included in the memory cell array 110' of the semiconductor memory device 100'.

Figure 16:
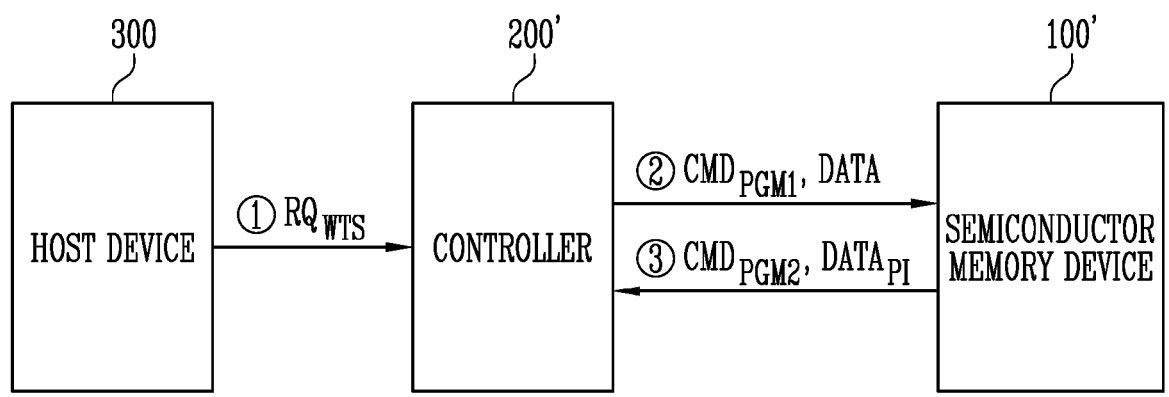
FIG. 16 is a diagram illustrating the controller of FIG. 15 that controls the test operation of the semiconductor memory device according to an embodiment of the present disclosure.

FIG. 16 is a diagram illustrating the controller of FIG. 15 that controls the test operation of the semiconductor memory device according to an embodiment of the present disclosure. A controller that controls a write test operation of the semiconductor memory device is described with reference to FIG. 16.

Referring to FIG. 16, first, the host device 300 transmits the write test request $RQ_{WTS}$ to the controller 200' of the storage device (①). For example, the host device 300 may determine to perform a write test operation on 1 megabyte (MB) of the storage area included in the storage device. In this case, the write test request $RQ_{WTS}$ may include information indicating that a performance range of the write test operation is 1 MB. The controller 200' may generate a program command $CMD_{PGM1}$ based on the received write test request $RQ_{WTS}$. More specifically, in response to the write test request $RQ_{WTS}$, the memory test controller 210' of the controller 200' may generate the program command $CMD_{PGM1}$ corresponding to the target range of the write test operation included in the write test request $RQ_{WTS}$. That is, when the write test request $RQ_{WTS}$ includes information indicating that the performance range of the write test operation is 1 MB, the memory test controller 210' may generate the program command $CMD_{PGM1}$ for programming data of 1 MB of the storage area of the memory cell array included in the semiconductor memory device 100'.

The controller 200' may transmit the generated program command $CMD_{PGM1}$ to the semiconductor memory device 100' (②). Together with the program command $CMD_{PGM1}$, the controller 200' may transmit the program data DATA to the semiconductor memory device 100'. In this case, the program data DATA may not be the user data received from the host device 300, but may be data for the write test of the storage device 1000'. Therefore, the controller 200' may transmit arbitrary data to the semiconductor memory device 100' together with the program command $CMD_{PGM1}$. In an embodiment, the program data DATA transmitted to the semiconductor memory device 100' together with the program command $CMD_{PGM1}$ may be dummy data arbitrarily generated by the memory test controller 210'. In another embodiment, the program data DATA transmitted to the semiconductor memory device 100' together with the program command $CMD_{PGM1}$ may be cache data cached in the controller 200'.

In response to the received program command $CMD_{PGM1}$, the semiconductor memory device 100' performs the program operation. When the program operation of the semiconductor memory device 100' is completed, the controller 200' may determine a time taken for the semiconductor memory device 100' to perform the program operation. The controller 200' may update the performance information to include the time taken to perform the program operation in the performance information storage. The controller 200' may control the semiconductor memory device 100' to program the updated performance information. To this end, the controller 200' may transmit a program command $CMD_{PGM2}$ to the semiconductor memory device 100' together with updated performance information data $DATA_{PI}$ (③). The semiconductor memory device 100' may program the updated performance information data $DATA_{PI}$ in the performance information storage area 115', in response to the received program command $CMD_{PGM2}$.

Figure 17:
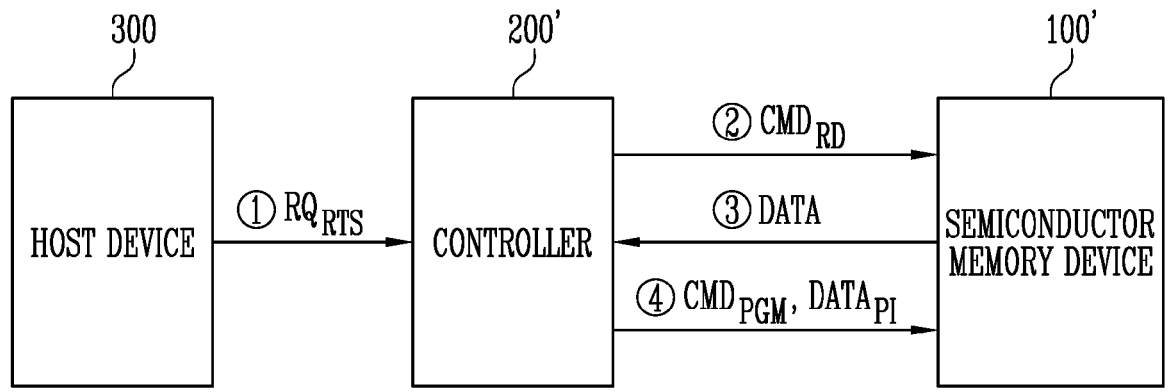
FIG. 17 is another diagram illustrating the controller of FIG. 15 that controls the test operation of the semiconductor memory device according to an embodiment of the present disclosure.

FIG. 17 is another diagram illustrating the controller of FIG. 15 that controls the test operation of the semiconductor memory device according to an embodiment of the present disclosure. A controller that controls a read test operation of the semiconductor memory device is described with reference to FIG. 17.

Referring to FIG. 17, first, the host device 300 transmits a read test request $RQ_{RTS}$ to the controller 200' of the storage device (①). The read test request $RQ_{RTS}$ may include information related to a target range of the read test operation to be performed by the storage device. For example, the host device 300 may determine to perform a read test operation on 5 MB of the storage area included in the storage device. In this case, the read test request $RQ_{RTS}$ may include information indicating that a performance range of the read test operation is 5 MB.

The controller 200' may generate a read command $CMD_{RD}$ based on the received read test request $RQ_{RTS}$. More specifically, in response to the read test request $RQ_{RTS}$, the memory test controller 210' of the controller 200' may generate the read command $CMD_{RD}$ corresponding to the target range of the read test operation included in the read test request $RQ_{RTS}$. That is, when the read test request $RQ_{RTS}$ includes information indicating that the performance range of the read test operation is 5 MB, the memory test controller 210' may generate the read command $CMD_{RD}$ for reading data of 5 MB of the storage area of the memory cell array included in the semiconductor memory device 100'.

The controller 200' may transmit the generated read command $CMD_{RD}$ to the semiconductor memory device 100' (②), Together with the read command $CMD_{RD}$, the controller 200' may transmit a read address to the semiconductor memory device 100'. The read address may be a physical address arbitrarily selected for the read test. That is, the controller 200' may transmit the arbitrary read address to the semiconductor memory device 100' together with the read command $CMD_{RD}$.

In response to the received read command $CMD_{RD}$, the semiconductor memory device 100' performs the read operation. The semiconductor memory device 100' may transmit the read data DATA to the controller 200' (③). As described above, when the read operation of the semiconductor memory device 100' is completed, the controller 200' may determine a time taken for the semiconductor memory device 100' to perform the read operation.

The controller 200' may update the performance information to include the time taken to perform the read operation. The controller 200' may control the semiconductor memory device 100' to program the data including the updated performance information data $DATA_{PI}$. To this end, the controller 200' may transmit the program command $CMD_{PGM}$ to the semiconductor memory device 100' together with the data including the updated performance information data $DATA_{PI}$ (④). The semiconductor memory device 100' may program the data including the updated performance information data $DATA_{PI}$ in the performance information storage area 115', in response to the received program command $CMD_{PGM}$.

Figure 18:
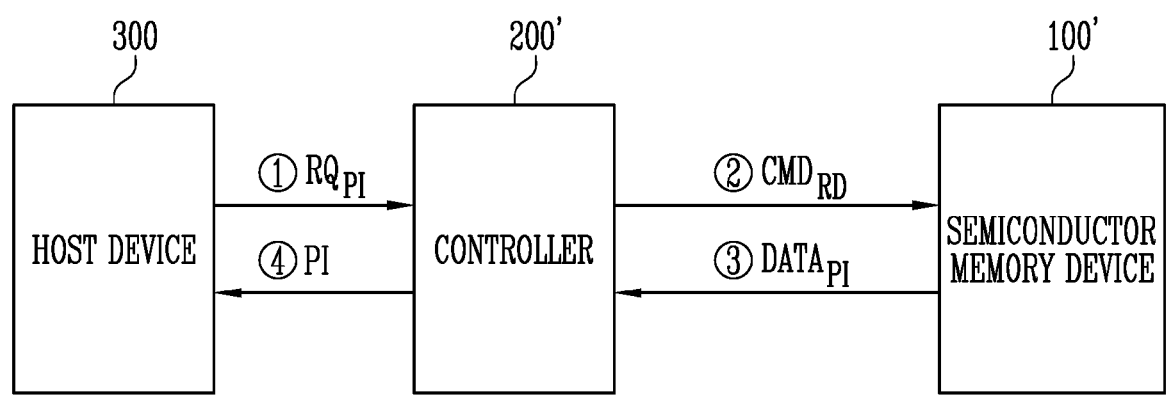
FIG. 18 is a diagram illustrating an operation of the controller of FIG. 15 that provides the performance information in response to the request of the host device according to an embodiment of the present disclosure.

FIG. 18 is a diagram illustrating an operation of the controller of FIG. 15 that provides the performance information in response to the request of the host device according to an embodiment of the present disclosure.

The host device 300 may require performance information PI stored in the storage device 1000' at a specific time. In this case, the host device 300 may generate a performance information request $RQ_{PI}$ and transmit the generated performance information request $RQ_{PI}$ to the storage device 1000' (①).

In response to the received performance information request $RQ_{PI}$, the controller 200' of the storage device 1000' may generate the read command $CDM_{RD}$ for reading the performance information data $DATA_{PI}$ stored in the performance information storage area 115'. The controller 200' may transmit the generated read command $CDM_{RD}$ to the semiconductor memory device 100' (②).

The semiconductor memory device 100' reads the performance information data $DATA_{PI}$ stored in the performance information storage area 115', in response to the received read command $CDM_{RD}$. The semiconductor memory device 100' may transmit the read performance information data $DATA_{PI}$ to the controller 200' (③).

The controller 200' may receive the performance information data $DATA_{PI}$ from the semiconductor memory device 100' and generate the performance information PI from the received performance information data $DATA_{PI}$. In this case, the performance information data $DATA_{PI}$ and the performance information PI may be substantially the same data. The controller 200' may transmit the performance information PI to the host device 300 (④).

Figure 19:
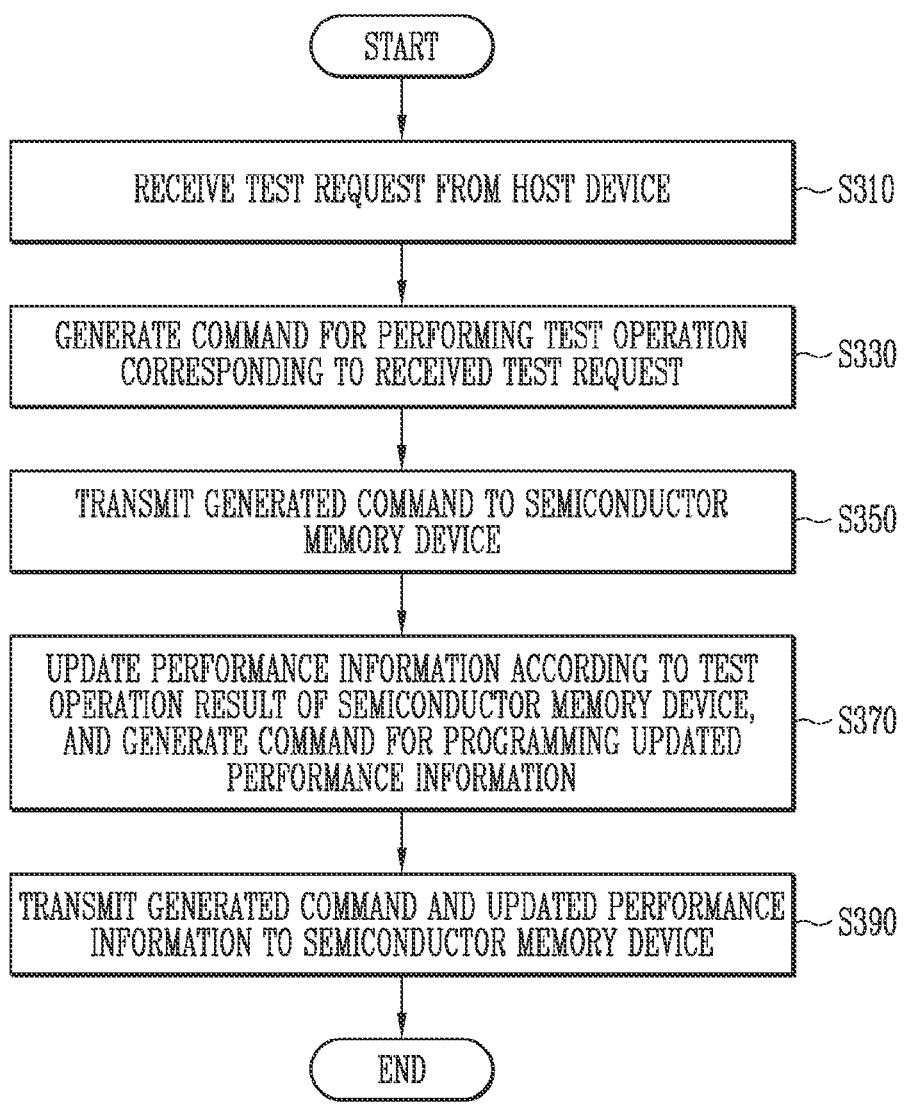
FIG. 19 is a flowchart illustrating a method of operating a controller according to another embodiment of the present disclosure.

FIG. 19 is a flowchart illustrating a method of operating a controller according to another embodiment of the present disclosure.

Referring to FIG. 19, the method of operating the controller according to another embodiment of the present disclosure includes receiving the test request from the host device 300 (S310), generating a command for performing the test operation corresponding to the received test request (S330), transmitting the generated command to the semiconductor memory device (S350), updating the performance information according to the test operation result of the semiconductor memory device and generating the command for programming the updated performance information (S370), and transmitting the generated command and updated performance information to the semiconductor memory device (S390).

In operation S310, the controller 200' may receive the test request from the host device 300. The test request may be the write test request $RQ_{WTS}$ or the read test request $RQ_{RTS}$.

In operation S330, the memory test controller 210' of the controller 200' may generate a command for controlling the semiconductor memory device 100' to perform the test operation corresponding to the received test request. When the test request received in operation S310 is the write test request $RQ_{WTS}$, the command generated in operation S330 may be the program command $CMD_{PGM}$. When the test request received in operation S310 is the read test request $RQ_{RTS}$, the command generated in operation S330 may be the read command $CMD_{RD}$.

In operation S350, the controller 200' transmits the generated command to the semiconductor memory device 100'. Accordingly, the semiconductor memory device 100' may perform the operation corresponding to the received command. When the operation of the semiconductor memory device 100' is completed, in operation S370, the controller 200' updates the performance information based on a result of the test operation of the semiconductor memory device. That is, the controller 200' may generate the performance information entry corresponding to the received test request. The controller 200' may update the performance information to include the generated performance information entry into the performance information, and generate the command for programming the updated performance information.

In operation S390, the controller 200' may transmit the generated command and updated performance information to the semiconductor memory device 100'. The semiconductor memory device 100' may store the updated performance information in the performance information storage area 115' of the memory cell array 110' based on the received command.

FIG. 20 is a flowchart illustrating a method of operating the controller that provides the performance information in response to the request of the host device according to an embodiment of the present disclosure.

Referring to FIG. 20, the method of operating the controller 200' includes receiving the performance information request $RQ_{PI}$ from the host device 300 (S410), generating the command for reading the data stored in the performance information storage area (S430), transmitting the generated command to the semiconductor memory device (S450), receiving the data read by the semiconductor memory device (S470), and transmitting the received data to the host device as the performance information (S490).

As shown in FIG. 18, in operation S410, the controller 200' may receive the performance information request $RQ_{PI}$ from the host device 300. Accordingly, the controller 200' may generate the read command $CMD_{RD}$ for reading the performance information data (S430). The controller 200' may transmit the generated read command $CMD_{RD}$ to the semiconductor memory device 100' (S450). In response to the read command $CMD_{RD}$, the semiconductor memory device 100' may read the performance information data $DATA_{PI}$ stored in the performance information storage area 115'. The controller 200' may receive the performance information data $DATA_{PI}$ read by the semiconductor memory device 100' (S470). The controller 200' may generate the performance information PI based on the received performance information data $DATA_{PI}$ and transmit the generated performance information to the host device 300 (S490).

Referring to FIGS. 19 and 20, the controller 200' according to another embodiment of the present disclosure may control the storage device 1000' to perform the test operation according to the request from the host device 300, and generate the test result as the performance information of the storage device 1000'. The controller 200' may control the semiconductor memory device 100' to store the generated performance information in the performance information storage area 115' in the memory cell array 110' as the performance information data $DATA_{PI}$. When the performance information request exists from the host device 300, the controller 200' may control the semiconductor memory device 100' to read the performance information data $DATA_{PI}$ updated to the most recent state. The controller 200' may generate the performance information PI based on the read performance information data $DATA_{PI}$ and provide the generated performance information PI to the host device 300.

FIG. 21 is a diagram illustrating a test request transmitted from the host device to the storage device according to an embodiment of the present disclosure.

Referring to FIG. 21, the host device 300 may generate a test request including fields indicating each of a test type, a test time, and a test target range. A first field of the test request may indicate the type of the test operation to be performed by the storage device 1000. For example, the write test or the read test corresponds to one of the types of the test operation.

A second field may indicate a duration for performing the targeted test operation. For example, the host device 300 may desire to designate a duration for the test operation to be performed by the storage device 1000. For example, when the test time is 1 second (sec), the second field of the test request may be filled with data indicating 1 second (sec). In this case, the storage device 1000 receiving the corresponding test request may continue the test operation for 1 second. In such a method, the host device 300 may control the test operation time performed by the storage device 1000. A third field of the test request may indicate the test target range. As in the above-described example, the test target range may mean the data size of the target on which the test operation is performed.

FIG. 22 is a diagram illustrating still another configuration of the entry included in the performance information according to an embodiment of the present disclosure. Referring to FIG. 22, a performance information entry including more data fields than those of FIG. 10 is shown. More specifically, referring to FIG. 22, one performance information entry may include seven fields. A first field may indicate a serial number of the test operation. A second field may indicate the type of the test operation. For example, the write test or the read test corresponds to one of the types of the test operation. A third field may indicate the duration of the test operation. For example, when a value indicated by the second field of the test request received from the host device 300 shown in FIG. 21 is 1 second (sec), the storage device 1000 may continue the corresponding test operation for 1 second.

A fourth field may indicate the test target range. As in the above-described example, the test target range may mean the data size of the target on which the test operation is performed. A fifth field and a sixth field may indicate the test result. Among them, the fifth field may indicate a specific measurement value when the test operation is successful. For example, when the test type is the write test, the test result may indicate a write speed measured in the write operation for the test target range. As another example, when the test type is the read test, the test result may indicate a read speed measured in the read operation for the test target range. The sixth field may indicate the performance status of the test operation. For example, when the write operation is failed, the sixth field of the entry may be filled with data indicating the failure of the write operation. As another example, when the read operation is successful, the sixth field of the entry may be filled with data indicating the success of the read operation. Therefore, the result of the test operation may include the fifth field indicating the measurement value and the sixth field indicating the test performance status. The fifth field may be filled with data only when the test operation is successful.

The seventh field is a field indicating whether the measured value, which is the test performance result, is greater than a predetermined threshold value. For example, when the threshold value for the read operations is 400 Mb per second, and the threshold value for the write operations is set to 150 Mb per second, the seventh field may include data indicating whether the result measurement value for each read or write operation is greater than 400 Mb per second or 150 Mb per second. Similarly to the fifth field, the seventh field may be filled with data only when the test operation is successful and the measurement value is generated. From a standpoint of the host device 300, when the test performance result is greater than the predetermined threshold value, it may be determined that the operation of the storage device 1000 is normal. From the standpoint of the host device 300, when the test performance result is less than or equal to the predetermined threshold value, it may be determined that a problem occurred in the storage device 1000.

FIG. 23 is a diagram illustrating the performance information including the entry of FIG. 22 according to an embodiment of the present disclosure.

Referring to FIG. 23, performance information including N entries indicating results of N test operations is shown. Referring to a first row, in response to the test request from the host device 300, the storage device 1000 may perform the read test on a target range of 1 GB for 10 seconds. Referring to a sixth field of the first row, the corresponding read test operation may be successful. Accordingly, the read speed measured as a result of the read test operation is filled in a fifth field of the first row. In a first test operation, the read speed may be measured at 500 Mb per second. In the above-described example, since the threshold value for the read speed is 400 Mb per second, data indicating that the measured value of the test result exceeds the threshold value may be included in a seventh field of the first row. For convenience of discussion, in FIG. 23, the data indicating that the measured value of the test result exceeds the threshold value is displayed by a symbol "O".

Referring to a second row, in response to the test request from the host device 300, the storage device 1000 may perform the write test on the target range of 500 MB for 1 second. Referring to a sixth field of the second row, the corresponding read test operation may be failed. Accordingly, a measured value of the write test operation is not filled. Similarly, data indicating whether the measured value exceeds the threshold value is also not filled.

Referring to a third row, in response to the test request from the host device 300, the storage device 1000 may perform the write test on a target range of 2 GB for 10 seconds. Referring to a sixth field of the third row, the corresponding write test operation may be successful. Accordingly, the write speed measured as a result of the write test operation is filled in a fifth field of the third row. In a third test operation, the write speed may be measured at 480 Mb per second. In the above-described example, since the threshold value for the write speed is 150 Mb per second, data indicating that the measured value of the test result exceeds the threshold value may be included in a seventh field of the third row.

Referring to a fourth row, in response to the test request from the host device 300, the storage device 1000 may perform the read test on a target range of 1 GB for 1 second. Referring to a sixth field of the fourth row, the corresponding read test operation may be aborted. Accordingly, the measured value of the read test operation is not filled. Similarly, data indicating whether the measured value exceeds the threshold value is also not filled.

In a method described above, each of the entries for the N test operations may be included in the performance information. Referring to an N-th row, in response to the test request from the host device 300, the storage device 1000 may perform the read test and the write test on the target range of 1 GB for 10 seconds. Referring to a sixth field of the N-th row, the corresponding read test and write test operations may be successful. In an N-th test operation, the read speed may be measured at 505 MB per second and the write speed may be measured at 100 MB per second. In the above-described example, the threshold value for the read speed is 400 Mb per second and the threshold value for the write speed is 150 Mb per second. That is, the read speed exceeds the threshold value, but the write speed does not reach the threshold value. Therefore, data indicating that the measured value of the test result did not exceed the threshold value may be included in the seventh field of the N-th row. For convenience of discussion, in FIG. 23, the data indicating that the measured value of the test result did not exceed the threshold value is displayed by a symbol "X".

In an embodiment, when receiving the performance information request $RQ_{PI}$ from the host device 300, the storage device 1000 may transmit all entries included in the performance information to the host device 300. In this case, all of first to N-th entries included in the performance information may be transmitted to the host device 300.

In another embodiment, when receiving the performance information request $RQ_{PI}$ from the host device 300, the storage device 1000 may transmit only entries corresponding to a successful test operation among the entries included in the performance information to the host device 300. That is, when the test operation is failed or the test operation is aborted, the storage device 1000 may not transmit the corresponding entries to the host device 300. For example, in the example of FIG. 23, a second entry and a fourth entry among the first to N-th entries included in the performance information may not be transmitted to the host device 300.

The host device 300 may recognize the current status of the storage device 1000 based on the received performance information. In an embodiment, the host device 300 may determine whether a problem occurred in the performance of the storage device 1000 by referring to the seventh field of the entry included in the received performance information. That is, when the measured value exceeds the threshold value as a result of the test, the host device 300 may determine that the storage device 1000 normally operates. When the measurement value does not exceed the threshold value as a result of the test, the host device 300 may determine that a problem occurred in the operation of the storage device 1000.

Figure 24:
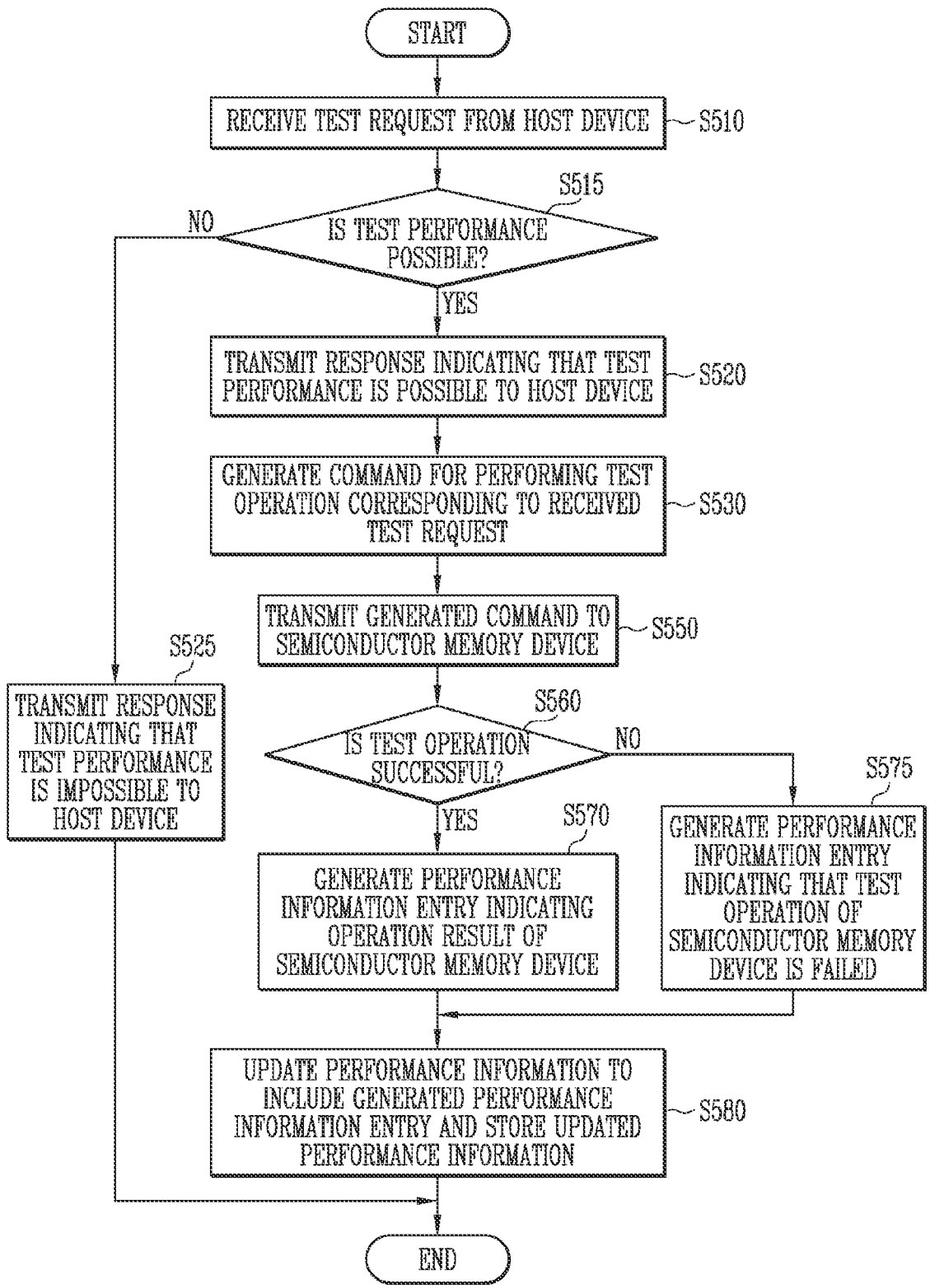
FIG. 24 is a flowchart illustrating a method of operating a controller according to another embodiment of the present disclosure.

FIG. 24 is a flowchart illustrating a method of operating a controller according to another embodiment of the present disclosure. Referring to FIG. 24, the method of operating the controller according to another embodiment of the present disclosure includes receiving the test request from the host device 300 (S510), determining whether test performance corresponding to the received request is possible (S515), when the test performance is possible (S515: Yes), transmitting a response indicating that the test performance is possible to the host device 300 (S520), generating, in response to the test request, the command for performing the test operation corresponding to the received test request (S530), transmitting the generated command to the semiconductor memory device to control the semiconductor memory device to perform the test operation (S550), determining whether the test operation is successful (S560), when the test operation is successful (S560: Yes), generating the performance information entry indicating the test operation result of the semiconductor memory device (S570), and updating the performance information to include the generated performance information entry into the performance information and storing the updated performance information (S580). Further, the method of operating the controller according to another embodiment of the present disclosure may further include, when the test performance is not possible (S515: No), transmitting a response indicating that the test performance is not possible to the host device (S525). In addition, the method of operating the controller according to another embodiment of the present disclosure may further include, when the test operation is failed (S560: No), generating a performance information entry indicating that the test operation of the semiconductor memory device is failed (S575).

In operation S510, the controller 200 may receive the test request from the host device 300. The test request may be the write test request $RQ_{WTS}$ or the read test request $RQ_{RTS}$. The controller 200 determines whether the test performance is possible on the semiconductor memory device 100, in response to the test request (S515). When the test performance is possible (S515: Yes), the controller 200 proceeds to operation S520 and transmits the response indicating that the test performance is possible to the host device 300. In an embodiment, the memory test controller 210 may transmit the response to the host device 300.

A situation in which the test operation is impossible due to an internal operation performance of the storage device 1000 may exist. In addition, when firmware performed by the controller 200 of the storage device 1000 does not support the test operation, the test operation may be impossible. Therefore, in this case, the controller 200 determines that the test performance is impossible (S515: No), and transmits the response indicating that the test performance is impossible to the host device 300 (S525). In an embodiment, the memory test controller 210 may transmit the response to the host device 300.

In operation S530, the memory test controller 210 of the controller 200 may generate the command for controlling the semiconductor memory device 100 to perform the test operation corresponding to the received test request. When the test request received in operation S510 is the write test request $RQ_{WTS}$, the command generated in operation S530 may be the program command $CMD_{PGM}$. When the test request received in operation S510 is the read test request $RQ_{RTS}$, the command generated in operation S530 may be the read command $CMD_{RD}$.

In operation S550, the controller 200 transmits the generated command to the semiconductor memory device 100. Accordingly, the semiconductor memory device 100 may perform the operation corresponding to the received command. The controller 200 determines whether the operation is successful. When the operation of the semiconductor memory device 100 is successful, the controller 200 determines that the test operation is successful (S560: Yes). In this case, the controller 200 generates the performance information entry indicating the test operation result of the semiconductor memory device (S570). At this time, the performance information entry generated in operation S570 may be the performance information entry shown in FIG. 22. More specifically, when the test operation is successful (S560: Yes), the sixth field of the performance information entry of FIG. 22 is filled with the value indicating "test success", the fifth field is filled with the measured value according to the operation result, and the seventh field is filled with the value indicating whether the measured value according to the operation result exceeds the threshold value.

When the operation of the semiconductor memory device 100 is failed, the controller 200 determines that the test operation is failed (S560: No). In this case, the controller 200 generates the performance information entry indicating that the test operation of the semiconductor memory device is failed (S575). At this time, the performance information entry generated in operation S575 may be the performance information entry shown in FIG. 22. More specifically, when the test operation has failed (S560: No), the sixth field of the performance information entry of FIG. 22 is filled with the value indicating "test failure", and the fifth and seventh fields may not be filled with any value.

Thereafter, in operation S580, the performance information may be updated to include therein the performance information entry generated in operation S570 or S575, and the updated performance information may be stored in the performance information storage 230. In another embodiment, the updated performance information may be stored in the performance information storage area 115' of the semiconductor memory device 100.

Figure 25:
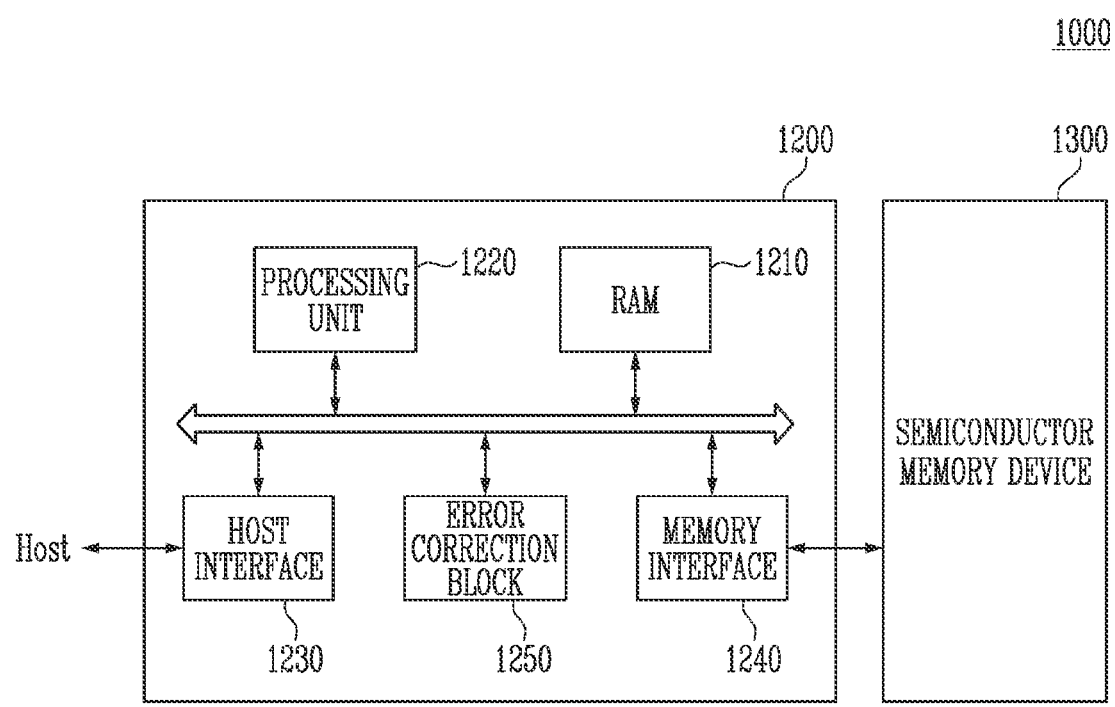
FIG. 25 is a block diagram illustrating a storage device 1000 including a semiconductor memory device and a controller according to an embodiment of the present disclosure.

FIG. 25 is a block diagram illustrating a storage device 1000 including a semiconductor memory device and a controller according to an embodiment of the present disclosure.

The semiconductor memory device 1300 of FIG. 25 may be configured and may operate similarly to the semiconductor memory device 100 described with reference to FIGS. 1 and 2. In another embodiment, the semiconductor memory device 1300 of FIG. 25 may be configured and may operate similarly to the semiconductor memory device 100' described with reference to FIG. 15. Hereinafter, a repetitive description is omitted.

The controller 1200 is connected to a host device Host and the semiconductor memory device 1300. The controller 1200 is configured to access the semiconductor memory device 1300 in response to a request from the host device Host. For example, the controller 1200 is configured to control read, program, erase, and background operations of the semiconductor memory device 1300. The controller 1200 is configured to provide an interface between the semiconductor memory device 1300 and the host device Host. The controller 1200 is configured to drive firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as one of an operation memory of the processing unit 1220, a cache memory between the semiconductor memory device 1300 and the host device Host, and a buffer memory between the semiconductor memory device 1300 and the host device Host.

The processing unit 1220 controls an overall operation of the controller 1200. The processing unit 1220 is configured to control the read, program, erase, and background operations of the semiconductor memory device 1300. The processing unit 1220 is configured to drive firmware for controlling the semiconductor memory device 1300. The processing unit 1220 may perform a function of a flash translation layer (FTL). The processing unit 1220 may convert a logical block address (LBA) provided by the host device into a physical block address (PBA) through the FTL. The FTL may receive the logical block address (LBA) and convert the LBA into the PBA by using a mapping table. There are several address mapping methods of the FTL according to a mapping unit.

A representative address mapping method includes a page mapping method, a block mapping method, and a hybrid mapping method.

The host interface 1230 includes a protocol for performing data exchange between the host device Host and the controller 1200. In an embodiment, the controller 1200 is configured to communicate with the host device Host through at least one of various communication standards or interfaces such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1240 interfaces with the semiconductor memory device 1300. For example, the memory interface 1240 includes a NAND interface or a NOR interface.

The error correction block 1250 is configured to detect and correct an error of data received from the semiconductor memory device 1300 using an error correcting code (ECC). The error correction block 1250 may correct an error by using the ECC on read page data. The error correction block 1250 may correct an error by using a coded modulation such as a low density parity check (LDPC) code, a Bose, Chaudhri, Hocquenghem (BCH) code, a turbo code, a Reed-Solomon code, a convolution code, a recursive systematic code (RSC), a trellis-coded modulation (TCM), a block coded modulation (BCM), and a hamming code.

During a read operation, the error correction block 1250 may correct an error of the read page data. Decoding may be failed when the read page data includes error bits that exceed a correctable number of bits. The decoding may be successful when the page data includes error bits equal to or less than the correctable number of bits. The success of the decoding indicates that a read command is passed. The failure of the decoding indicates that the read command is failed. When the decoding is successful, the controller 1200 outputs the page data in which the error is corrected to the host.

The controller 200 of FIG. 1 may be implemented as the controller 1200 shown in FIG. 25. In this case, the memory test controller 210 of FIG. 1 may be implemented as firmware driven by the processing unit 1220. Additionally, the performance information storage 230 of FIG. 1 may be implemented as the RAM 1210 of FIG. 25.

In another embodiment, the controller 200' of FIG. 15 may also be implemented as the controller 1200 shown in FIG. 25. In this case, the memory test controller 210' of FIG. 15 may be implemented as firmware driven by the processing unit 1220.

The controller 1200 and the semiconductor memory device 1300 may be integrated into one semiconductor device. In an embodiment, the controller 1200 and the semiconductor memory device 1300 may be integrated into one semiconductor device to configure a memory card. For example, the controller 1200 and the semiconductor memory device 1300 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, or MMCmicro), a secure digital (SD) card (SD, miniSD, microSD, or SDHC), and a universal flash storage (UFS).

The controller 1200 and the semiconductor memory device 1300 may be integrated into one semiconductor device to configure a semiconductor drive (solid state drive (SSD)). The semiconductor drive (SSD) includes a storage device configured to store data in the semiconductor memory. When the storage device is used as the semiconductor drive (SSD), an operation speed of the host device Host connected to the storage device is dramatically improved.

As another example, the storage device 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 1300 or the storage device may be mounted as a package of various types. For example, the semiconductor memory device 1300 or the storage device may be packaged and mounted in a method such as a package on package (POP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC) package, a shrink small outline package (SSOP), a thin small outline package (TSOP), a system in package (SIP), a multi-chip package (MCP), a wafer-level fabricated package (WFP), or a wafer-level processed stack package (WSP).

Figure 26:
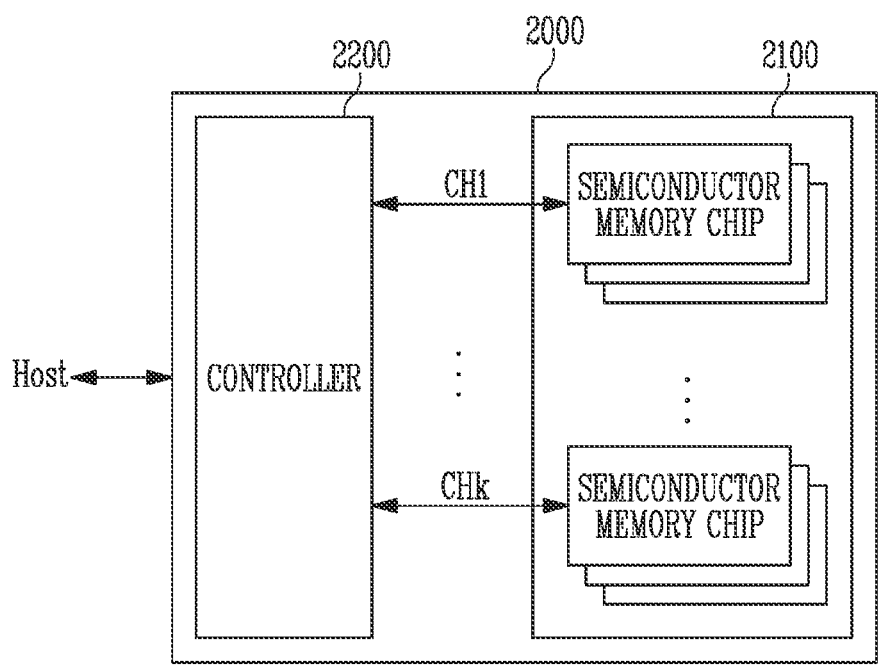
FIG. 26 is a block diagram illustrating an application example 2000 of the storage device of FIG. 25 according to an embodiment of the present disclosure.

FIG. 26 is a block diagram illustrating an application example 2000 of the storage device of FIG. 25 according to an embodiment of the present disclosure.

Referring to FIG. 26, the storage device 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 26, the plurality of groups communicate with the controller 2200 through first to k-th channels CH1 to CHk, respectively. Each semiconductor memory chip is configured and is operated similarly to the semiconductor memory device 1300 described with reference to FIG. 25.

Each group is configured to communicate with the controller 2200 through one common channel. The controller 2200 is configured similarly to the controller 1200 described with reference to FIG. 25 and is configured to control the plurality of memory chips of the semiconductor memory device 2100 through the plurality of channels CH1 to CHk.

In FIG. 26, the plurality of semiconductor memory chips are connected to one channel. However, it will be understood that the storage device 2000 may be modified so that one semiconductor memory chip is connected to one channel.

Figure 27:
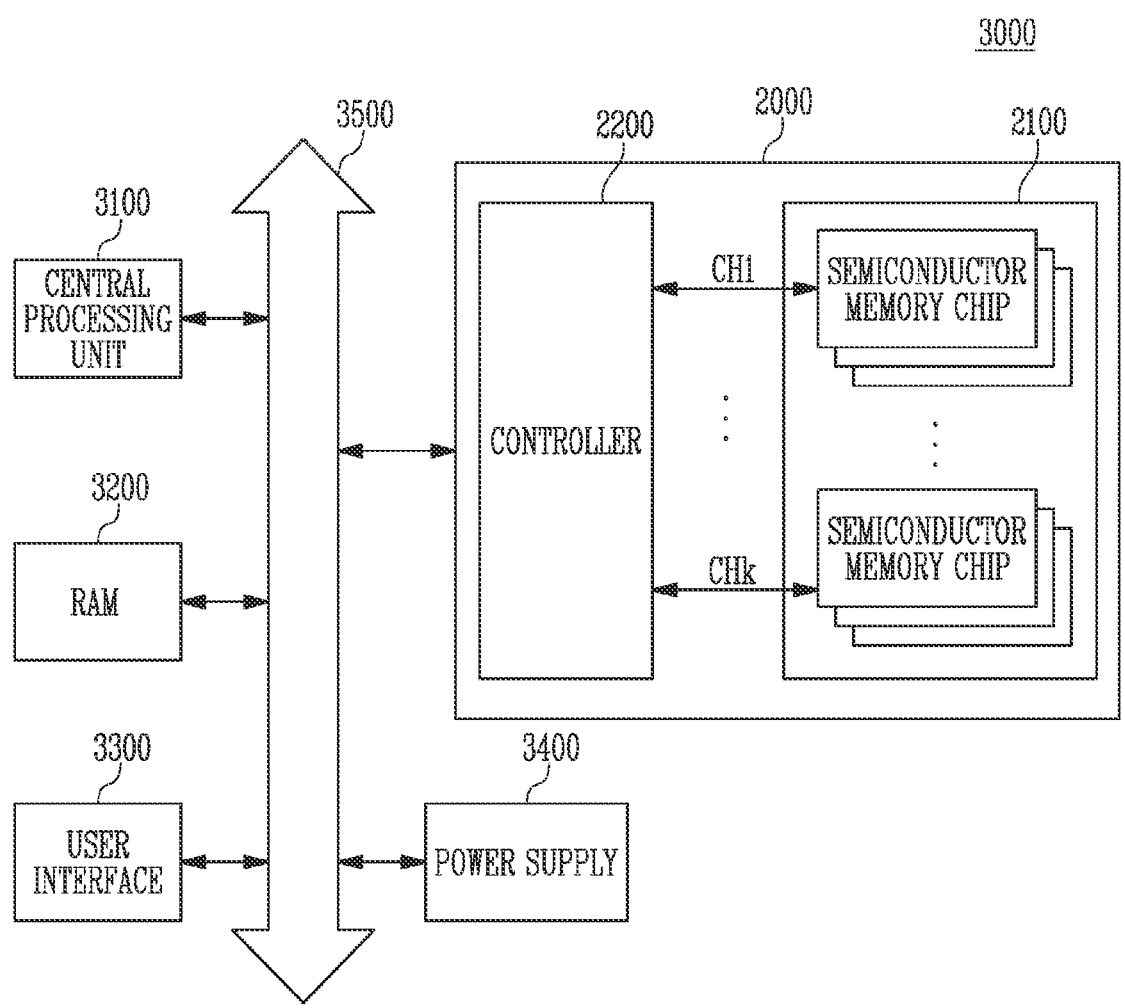
FIG. 27 is a block diagram illustrating a computing system including the storage device described with reference to FIG. 26 according to an embodiment of the present disclosure.

FIG. 27 is a block diagram illustrating a computing system including the storage device described with reference to FIG. 26 according to an embodiment of the present disclosure.

Referring to FIG. 27, the computing system 3000 includes a central processing unit 3100, a random access memory (RAM) 3200, a user interface 3300, a power supply 3400, a system bus 3500, and the storage device 2000.

The storage device 2000 is electrically connected to the central processing unit 3100, the RAM 3200, the user interface 3300, and the power supply 3400 through the system bus 3500. Data provided through the user interface 3300 or processed by the central processing unit 3100 is stored in the storage device 2000.

In FIG. 27, the semiconductor memory chip 2100 is connected to the system bus 3500 through the controller 2200. However, the semiconductor memory chip 2100 may be configured to be directly connected to the system bus 3500. At this time, a function of the controller 2200 is performed by the central processing unit 3100 and the RAM 3200.

In FIG. 27, the storage device 2000 described with reference to FIG. 26 is provided. However, the storage device 2000 may be replaced with the storage device 1000 described with reference to FIG. 25. In an embodiment, the computing system 3000 may be configured to include both of the storage devices 1000 and 2000 described with reference to FIGS. 25 and 26.

The embodiments of the present disclosure and drawings are merely provided as specific examples to easily describe the technical content of the present disclosure and to help understanding of the present disclosure, and are not intended to limit the scope of the present disclosure. It will be apparent to those of ordinary skill in the art that other modified examples based on the technical spirit of the present disclosure may be implemented in addition to the embodiments disclosed herein and the following claims. Furthermore, the embodiments may be combined to form additional embodiments.

What is claimed is:

1. A controller comprising:
a memory test controller configured to:
receive a test request from an external device,
transmit, to the external device, a response indicating whether performance of a test operation corresponding to the test request is possible, and
generate a command in response to the test request; and
a performance information storage configured to store a result of the test operation, which is performed by a semiconductor memory device in response to the command,
wherein the result includes:
at least one of a read speed or a write speed during the test operation; and
data indicating whether the read speed or the write speed is greater than a predetermined threshold value.

2. The controller of claim 1,
wherein the test request is a read test request,
wherein the test operation is a read test operation,
wherein, when performance of the read test operation corresponding to the read test request is possible, the memory test controller transmits the response indicating that the performance of the read test operation is possible to the external device,
wherein the command is a read command, and
wherein the memory test controller is further configured to transmit the read command to the semiconductor memory device to control the semiconductor memory device to perform the read test operation.

3. The controller of claim 2, wherein the result further includes a time taken for the read test operation.

4. The controller of claim 1,
wherein the test request is a write test request,
wherein the test operation is a write test operation,
wherein, when performance of the write test operation corresponding to the write test request is possible, the memory test controller transmits the response indicating that the performance of the write test operation is possible to the external device, wherein the command is a write command, and
wherein the memory test controller is further configured to transmit the write command to the semiconductor memory device to control the semiconductor memory device to perform the write test operation.

5. The controller of claim 4, wherein the memory test controller is further configured to generate dummy data and transmit the dummy data to the semiconductor memory device together with the write command.

6. The controller of claim 4, wherein the memory test controller is further configured to transmit data cached in the controller to the semiconductor memory device together with the write command.

7. The controller of claim 4, wherein the result further includes a time taken for the write test operation.

8. The controller of claim 1, wherein the memory test controller is further configured to determine, based on the test request, a size of a data area on which the test operation is to be performed among storage areas included in the semiconductor memory device.

9. The controller of claim 1, wherein the memory test controller is further configured to provide, to the external device, the result stored in the performance information storage in response to a performance information request received from the external device.

10. A method of operating a controller, the method comprising:
receiving a test request from an external device;
determining whether performance of a test operation corresponding to the test request is possible;
transmitting, to the external device, a response indicating whether the performance of the test operation is possible;
generating a command in response to the test request;
transmitting the command to a semiconductor memory device to control the semiconductor memory device to perform the test operation;
updating performance information based on a result of the test operation; and
storing the updated performance information,
wherein the performance information includes:
at least one of a read speed or a write speed during the test operation; and
data indicating whether the read speed or the write speed is greater than a predetermined threshold value.

11. The method of claim 10,
wherein the test request is a read test request,
wherein the test operation is a read test operation, and
wherein the command is a read command.

12. The method of claim 11,
further comprising receiving, as a result of the read test operation, read data from the semiconductor memory device,
wherein the updating comprises generating a performance information entry including at least one of a time taken for the read test operation or the read speed during the read test operation and including the performance information entry into the performance information, when the read test operation is successful.

13. The method of claim 10,
wherein the test request is a write test request,
wherein the test operation is a write test operation, and
wherein the command is a program command with program data.

14. The method of claim 13, wherein the updating comprises generating a performance information entry including a time taken for the write test operation or the write speed during the write test operation and including the performance information entry into the performance information, when the write test operation is successful.

15. The method of claim 10, further comprising:
receiving a performance information request from the external device; and
transmitting the stored performance information to the external device in response to the performance information request.

16. A computing system comprising:
a storage device configured to store data; and
a host device configured to generate a test request for testing the storage device and transmit the test request to the storage device,
wherein the storage device is further configured to perform a read test operation or a write test operation of a semiconductor memory device included in the storage device in response to the test request, and store a result of the read test operation or the write test operation as performance information,
wherein the performance information includes:
at least one of a read speed during the read test operation or a write speed during the write test operation; and
data indicating whether the read speed or the write speed is greater than a predetermined threshold value.

17. The computing system of claim 16,
wherein the host device is further configured to transmit a performance information request to the storage device,
wherein the storage device is further configured to transmit the performance information to the host device in response to the performance information request, and
wherein the host device is further configured to determine whether the storage device is normal based on the data indicating whether the read speed or the write speed is greater than the predetermined threshold value included in the performance information.

* * * * *